United States Patent
Kessels et al.

(12)

(10) Patent No.: US 11,621,377 B2
(45) Date of Patent: *Apr. 4, 2023

(54) LED AND PHOSPHOR COMBINATIONS FOR HIGH LUMINOUS EFFICACY LIGHTING WITH SUPERIOR COLOR CONTROL

(71) Applicant: Lumileds LLC, San Jose, CA (US)

(72) Inventors: Marcus Jozef Henricus Kessels, Eindhoven (NL); Hans-Helmut Bechtel, Aachen (DE); Johannes Willem Herman Sillevis Smitt, San Jose, CA (US); Wouter Soer, Eindhoven (NL)

(73) Assignee: Lumileds LLC, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/576,757

(22) Filed: Jan. 14, 2022

(65) Prior Publication Data

US 2022/0140205 A1    May 5, 2022

Related U.S. Application Data

(63) Continuation of application No. 16/431,094, filed on Jun. 4, 2019, now Pat. No. 11,233,178.

(60) Provisional application No. 62/680,918, filed on Jun. 5, 2018.

(51) Int. Cl.
*H01L 27/15* (2006.01)
*H01L 33/50* (2010.01)
*F21K 9/60* (2016.01)

(52) U.S. Cl.
CPC ............ *H01L 33/502* (2013.01); *F21K 9/60* (2016.08); *H01L 27/15* (2013.01)

(58) Field of Classification Search
CPC .......... H01L 27/15; H01L 33/502; F21K 9/60
See application file for complete search history.

(56) References Cited

U.S. PATENT DOCUMENTS

| 7,906,041 | B2 | 3/2011 | Li et al. |
| 8,395,311 | B2 | 3/2013 | Morimoto |
| 9,719,660 | B1* | 8/2017 | Petluri .................. F21V 9/30 |
| 11,233,178 | B2 | 1/2022 | Kessels et al. |
| 2017/0162547 | A1 | 6/2017 | Bergmann et al. |

(Continued)

FOREIGN PATENT DOCUMENTS

| EP | 2830093 A1 | 1/2015 |
| JP | 2008283155 A | 11/2008 |

(Continued)

OTHER PUBLICATIONS

From the EPO as the ISA, the International Search Report corresponding to PCT/US2019/035594, dated Sep. 26, 2019, 3 pages.

(Continued)

*Primary Examiner* — Trang Q Tran

(57) ABSTRACT

A light emitting device comprises a first group of one or more LEDs each configured to emit light having a blue color point in the 1931 CIE x,y Chromaticity Diagram, a second group of one or more LEDs each configured to emit light having a cyan or yellow color point in the 1931 CIE x,y Chromaticity Diagram, and a third group of one or more LEDs each configured to emit light having a red color point in the 1931 CIE x,y Chromaticity Diagram.

20 Claims, 30 Drawing Sheets

(56) References Cited

U.S. PATENT DOCUMENTS

2017/0211755 A1 7/2017 Jou et al.
2019/0371976 A1 12/2019 Kessels et al.

FOREIGN PATENT DOCUMENTS

| JP | 2009515030 A | 4/2009 |
| JP | 2009212275 A | 9/2009 |
| JP | 2014135150 A | 7/2014 |

OTHER PUBLICATIONS

From the EPO as the ISA, the Written Opinion of the International Search Authority corresponding to PCT/US2019/035594, dated Sep. 26, 2019, 7 pages.

* cited by examiner

|       | Example 1 |       | Example 2 |       | Example 3 |       | Example 4 |       |
|-------|-----------|-------|-----------|-------|-----------|-------|-----------|-------|
|       | x         | y     | x         | y     | x         | y     | x         | y     |
| R CP  | 0.567     | 0.304 | 0.608     | 0.308 | 0.613     | 0.368 | 0.606     | 0.361 |
| Y CP  | 0.504     | 0.467 | 0.511     | 0.471 | 0.424     | 0.492 | 0.452     | 0.479 |
| B CP  | 0.262     | 0.367 | 0.255     | 0.325 | 0.245     | 0.295 | 0.272     | 0.344 |
| Sum x | 1.33      |       | 1.37      |       | 1.28      |       | 1.33      |       |
| Sum y |           | 1.14  |           | 1.10  |           | 1.15  |           | 1.18  |
| gamut | 0.0229    |       | 0.0279    |       | 0.0297    |       | 0.0210    |       |

FIG. 1A

|       | Example 5 |       | Example 6 |       | Example 7 |       | Example 8 |       | Example 9 |       |
|-------|-----------|-------|-----------|-------|-----------|-------|-----------|-------|-----------|-------|
|       | x         | y     | x         | y     | x         | y     | x         | y     | x         | y     |
| R CP  | 0.541     | 0.373 | 0.560     | 0.379 | 0.596     | 0.376 | 0.583     | 0.373 | 0.561     | 0.408 |
| Y CP  | 0.395     | 0.476 | 0.379     | 0.547 | 0.324     | 0.522 | 0.427     | 0.489 | 0.356     | 0.525 |
| B CP  | 0.245     | 0.295 | 0.337     | 0.208 | 0.380     | 0.203 | 0.222     | 0.241 | 0.194     | 0.170 |
| Sum x | 1.18      |       | 1.276     |       | 1.300     |       | 1.23      |       | 1.11      |       |
| Sum y |           | 1.14  |           | 1.133 |           | 1.101 |           | 1.10  |           | 1.10  |
| gamut | 0.0209    |       | 0.0342    |       | 0.0393    |       | 0.0312    |       | 0.0459    |       |

FIG. 1B

|  | Sum x | | Sum y | | Gamut Area | | |
| --- | --- | --- | --- | --- | --- | --- | --- |
|  | min | max | min | max | min | max | Center |
| Example 1 | 1.275 | 1.389 | 1.070 | 1.215 | 0.017 | 0.030 | 0.023 |
| Example 2 | 1.316 | 1.430 | 1.036 | 1.181 | 0.021 | 0.036 | 0.028 |
| Example 3 | 1.224 | 1.338 | 1.087 | 1.232 | 0.020 | 0.039 | 0.030 |
| Example 4 | 1.272 | 1.386 | 1.116 | 1.261 | 0.013 | 0.029 | 0.021 |
| Example 5 | 1.123 | 1.237 | 1.076 | 1.221 | 0.013 | 0.028 | 0.021 |
| Example 6 | 1.218 | 1.332 | 1.066 | 1.210 | 0.024 | 0.043 | 0.034 |
| Example 7 | 1.242 | 1.356 | 1.033 | 1.178 | 0.027 | 0.049 | 0.039 |
| Example 8 | 1.174 | 1.288 | 1.035 | 1.180 | 0.023 | 0.039 | 0.031 |
| Example 9 | 1.053 | 1.167 | 1.035 | 1.180 | 0.036 | 0.055 | 0.046 |

FIG. 1C

| CCT K | 1899 | 2010 | 3035 | 3976 | 5015 |
|---|---|---|---|---|---|
| LE_lm_W | 277.5 | 287.1 | 305.4 | 303.1 | 295.5 |
| Lumen_White | 62.21 | 56.97 | 78.23 | 96.10 | 69.53 |
| Current_red | 73.6% | 53.5% | 42.4% | 58.7% | 55.7% |
| Current_yellow | 100.0% | 100.0% | 100.0% | 67.3% | 7.5% |
| Current_blue | 0.0% | 0.0% | 46.5% | 100.0% | 100.0% |
| x (LED) | 0.5297 | 0.5250 | 0.4342 | 0.3819 | 0.3450 |
| y (LED) | 0.4006 | 0.4127 | 0.4025 | 0.3790 | 0.3552 |
| CRI_Ra | 83.1 | 83.5 | 92.7 | 96.0 | 94.8 |
| CRI_R9 | 18.0 | 20.8 | 55.0 | 71.8 | 83.8 |

FIG. 2F

| CCT K | 1803 | 1999 | 3041 | 3983 | 5029 | 5962 | 6944 |
|---|---|---|---|---|---|---|---|
| LE_lm_W | 220.5 | 236.3 | 280.4 | 286.7 | 280.8 | 273.0 | 261.1 |
| Lumen_White | 63.78 | 64.98 | 74.20 | 100.06 | 95.66 | 80.12 | 69.53 |
| Current_red | 100.0% | 79.3% | 33.4% | 35.6% | 41.8% | 44.0% | 51.3% |
| Current_yellow | 95.0% | 100.0% | 100.0% | 100.0% | 58.8% | 25.2% | 0.0% |
| Current_blue | 0.0% | 4.5% | 34.1% | 76.6% | 100.0% | 100.0% | 100.0% |
| x (LED) | 0.5485 | 0.5270 | 0.4340 | 0.3817 | 0.3447 | 0.322423 | 0.306141 |
| y (LED) | 0.4079 | 0.4135 | 0.4029 | 0.3792 | 0.3552 | 0.338398 | 0.322192 |
| CRI_Ra | 93.5 | 93.2 | 92.4 | 93.3 | 94.9 | 95.9 | 95.8 |
| CRI_R9 | 85.4 | 87.0 | 85.9 | 88.5 | 96.2 | 91.2 | 69.4 |

FIG. 3F

| CCT_K | 1799 | 2000 | 3040 | 3995 | 5024 | 6002 | 6994 |
|---|---|---|---|---|---|---|---|
| LE_lm_W | 220.4 | 233.9 | 274.9 | 287.2 | 286.3 | 284.4 | 276.4 |
| Lumen_White | 47.43 | 55.48 | 103.55 | 147.87 | 111.11 | 90.54 | 76.54 |
| Current_red | 100.0% | 100.0% | 100.0% | 98.0% | 59.7% | 41.8% | 36.2% |
| Current_yellow | 27.3% | 37.0% | 79.8% | 100.0% | 56.3% | 34.0% | 16.0% |
| Current_blue | 0.1% | 2.6% | 36.1% | 92.1% | 100.0% | 100.0% | 100.0% |
| x (LED) | 0.5499 | 0.5266 | 0.4340 | 0.3816 | 0.3448 | 0.321558 | 0.305322 |
| y (LED) | 0.4088 | 0.4133 | 0.4029 | 0.3804 | 0.3556 | 0.338901 | 0.322122 |
| CRI_Ra | 96.9 | 97.4 | 97.3 | 95.1 | 93.9 | 92.8 | 93.5 |
| CRI_R9 | 82.7 | 89.5 | 96.1 | 88.9 | 83.5 | 78.8 | 85.1 |

FIG. 4F

| CCT_K | 1799 | 2001 | 3041 | 3984 | 5009 |
|---|---|---|---|---|---|
| LE_lm_W | 230.4 | 246.0 | 284.6 | 290.9 | 286.0 |
| Lumen_White | 51.98 | 63.03 | 119.96 | 124.40 | 86.96 |
| Current_red | 100.0% | 100.0% | 100.0% | 82.1% | 56.7% |
| Current_yellow | 34.8% | 48.9% | 86.2% | 56.2% | 11.0% |
| Current_blue | 0.0% | 2.6% | 53.2% | 100.0% | 100.0% |
| x (LED) | 0.5475 | 0.5267 | 0.4340 | 0.3818 | 0.3452 |
| y (LED) | 0.4059 | 0.4134 | 0.4030 | 0.3796 | 0.3556 |
| CRI_Ra | 93.6 | 94.7 | 95.0 | 94.4 | 94.4 |
| CRI_R9 | 65.5 | 70.3 | 80.2 | 82.3 | 85.7 |

FIG. 5F

| CCT_K | 1778 | 1992 | 3043 | 3995 | 5040 | 5954 | 6957 |
|---|---|---|---|---|---|---|---|
| LE_lm_W | 214.2 | 230.3 | 278.0 | 288.8 | 286.8 | 284.8 | 277.9 |
| Lumen_White | 33.75 | 40.04 | 77.05 | 109.91 | 121.15 | 96.55 | 79.83 |
| Current_red | 100.0% | 100.0% | 100.0% | 100.0% | 90.0% | 62.1% | 50.2% |
| Current_yellow | 5.0% | 14.6% | 57.7% | 74.0% | 59.0% | 34.4% | 14.4% |
| Current_blue | 0.0% | 0.0% | 16.0% | 56.3% | 100.0% | 100.0% | 100.0% |
| x (LED) | 0.5300 | 0.5125 | 0.4341 | 0.3817 | 0.3443 | 0.32257 | 0.305938 |
| y (LED) | 0.3808 | 0.3932 | 0.4034 | 0.3807 | 0.3546 | 0.338695 | 0.322131 |
| CRI_Ra | 93.6 | 95.4 | 95.1 | 93.8 | 93.1 | 92.4 | 92.7 |
| CRI_R9 | 78.3 | 85.7 | 89.7 | 84.7 | 81.0 | 77.4 | 80.7 |

FIG. 6F

| CCT_K | 1799 | 2160 | 2726 | 3064 | 3497 | 3999 | 4512 |
|---|---|---|---|---|---|---|---|
| LE_lm_W | 312.9 | 332.5 | 344.1 | 346.9 | 346.5 | 346.4 | 342.7 |
| CE_lm_Wblue | 47.42 | 60.66 | 92.21 | 107.11 | 97.03 | 89.09 | 84.68 |
| Current_red | 100.0% | 100.0% | 100.0% | 88.4% | 52.6% | 24.9% | 4.3% |
| Current_green | 12% | 34% | 76% | 100% | 100% | 100% | 100% |
| Current_blue | 0.0% | 2.0% | 18.9% | 32.9% | 43.3% | 51.2% | 60.6% |
| x (LED) | 0.5403 | 0.5097 | 0.4578 | 0.4329 | 0.4054 | 0.381341 | 0.360847 |
| y (LED) | 0.3971 | 0.4150 | 0.4102 | 0.4034 | 0.3907 | 0.379881 | 0.36599 |
| CRI Ra | 60.7 | 71.1 | 76.7 | 77.5 | 77.3 | 76.2 | 75.0 |
| CRI R9 | -50.6 | -30.7 | -17.2 | -15.2 | -16.0 | -21.4 | -27.5 |

FIG. 7F

| CCT_K | 1779 | 2158 | 2724 | 3063 | 3511 | 3972 | 4502 | 4727 |
|---|---|---|---|---|---|---|---|---|
| LE_lm_W | 280.4 | 298.5 | 312.7 | 317.8 | 321.4 | 322.7 | 322.7 | 320.2 |
| CE_lm_Wblu | 51.14 | 63.85 | 92.49 | 96.99 | 88.31 | 82.63 | 78.24 | 77.45 |
| Current_red | 100.0% | 100.0% | 100.0% | 82.3% | 51.1% | 28.0% | 8.0% | 0.0% |
| Current_green | 22% | 44% | 86% | 100% | 100% | 100% | 100% | 100% |
| Current_blue | 0.0% | 2.0% | 17.1% | 27.1% | 36.5% | 45.3% | 54.5% | 60.7% |
| x (LED) | 0.5472 | 0.5100 | 0.4577 | 0.4328 | 0.4052 | 0.382202 | 0.36114 | 0.35307 |
| y (LED) | 0.4020 | 0.4150 | 0.4097 | 0.4032 | 0.3918 | 0.379367 | 0.36582 | 0.356772 |
| CRI_Ra | 80.2 | 87.8 | 91.9 | 92.6 | 92.1 | 90.7 | 88.8 | 88.5 |
| CRI_R9 | 6.1 | 28.9 | 42.4 | 43.6 | 40.8 | 34.7 | 25.5 | 23.7 |

FIG. 8F

LED AND PHOSPHOR COMBINATIONS FOR HIGH LUMINOUS EFFICACY LIGHTING WITH SUPERIOR COLOR CONTROL

CROSS REFERENCE TO RELATED APPLICATIONS

This application is a continuation of U.S. patent application Ser. No. 16/431,094 filed on Jun. 4, 2019, which claims benefit of priority to U.S. Provisional Patent Application No. 62/680,918 titled "LED AND PHOSPHOR COMBINATIONS FOR HIGH LUMINOUS EFFICACY LIGHTING WITH SUPERIOR COLOR CONTROL" and filed Jun. 5, 2018. Each of the foregoing applications is incorporated herein by reference in its entirety.

FIELD OF THE INVENTION

This disclosure generally relates to combinations of phosphors and light emitting diodes having high luminous efficacy and improved color control.

BACKGROUND

Material systems for semiconductor light-emitting diodes and semiconductor laser diodes (both referred to herein as LEDs) include Group III-V semiconductors, particularly binary, ternary, and quaternary alloys of gallium, aluminum, indium, and nitrogen, also referred to as III-nitride materials. LEDs are often combined with a wavelength converting material such as a phosphor. An LED combined with one or more wavelength converting materials may be used to create white light or monochromatic light of other colors. All or only a portion of the light emitted by the LED may be converted by the wavelength converting material. Unconverted light may be part of the final spectrum of light, though it need not be. Examples of common devices include a blue-emitting LED combined with a yellow-emitting phosphor, a blue-emitting LED combined with cyan- and red-emitting phosphors, a UV-emitting LED combined with blue- and yellow-emitting phosphors, and a UV-emitting LED combined with blue-, cyan-, and red-emitting phosphors. The term "phosphor" is used herein to refer to any wavelength converting material, including but not limited to inorganic phosphor compounds.

In commercial applications, manufactured LED dice (L0) are packaged (L1), combined on a carrier (L2), and fitted into a module (L3) that can include drivers, controls, and sensors. Multiple L3 modules can be used in lamps or luminaires (L4) that in turn can be part of a complete home or commercial lighting system (L5).

A color point is a point in a chromaticity diagram characterizing a particular spectrum of light as a color perceived by a human with normal color vision. A correlated color temperature is the temperature corresponding to the point on the blackbody curve in a chromaticity diagram to which a color point is most closely correlated.

Light emitted by several differently colored direct emitting LEDs (e.g., semiconductor diode structures that directly emit blue, cyan, and red light) may be combined to provide white light having a desired color point and correlated color temperature. Alternatively, light emitted by one or more phosphor converted LEDs (e.g. a blue emitting LED exciting one or more phosphors) may individually or in combination provide white light having a desired color point and correlated color temperature. One or more direct emitting LEDs may be combined with light emitted by one or more phosphor converted LEDs to provide white light with a desired color point or correlated color temperature.

Combining multiple phosphors with a single blue emitting LED can result in interactions between the phosphors, for example absorption by one phosphor of light emitted by another, that reduces the efficiency of the device. Combining light emitted by direct emitting LEDs or by phosphor converted LEDS to make white light of a desired color point may also be inefficient if the desired white light color point is far from the color points of the light emission from the individual LEDs. Further, combining light emitted by (e.g., red) direct emitting LEDs with light emitted by phosphor converted LEDs may be difficult in practice as a result of differing drive current and temperature dependent behavior of the different LEDs.

SUMMARY

In one aspect of the invention, a light emitting device comprises a first group of one or more LEDs each configured to emit light having a blue color point in the 1931 CIE x,y Chromaticity Diagram, a second group of one or more LEDs each configured to emit light having a cyan or yellow color point in the 1931 CIE x,y Chromaticity Diagram, and a third group of one or more LEDs each configured to emit light having a red color point in the 1931 CIE x,y Chromaticity Diagram.

The first group of LEDs, the second group of LEDS, and the third group of LEDs are arranged to combine light emitted by the LEDs to form a white light output from the light emitting device. One or more of the primaries (blue color point, cyan or yellow color point, and red color point) may be desaturated, that is, distant from the monochromatic locus identifying monochromatic light in the chromaticity diagram. Desaturation moves the primary color points closer to the desired color point of the white light output, improving efficiency of the light emitting device, but as a trade-off reduces the gamut area of the chromaticity diagram spanned by the primaries and thereby reduces color tunability of the output of the light emitting device.

Some or all of the LEDs may be phosphor converted LEDs in which wavelength converting material partially or entirely converts blue light emitted by a semiconductor diode structure to light of a longer wavelength. The blue light emitted by the semiconductor diode structures may have a peak wavelength in the range of 430 nm to 475 nm, for example. Alternatively some of the LEDs may be direct emitting LEDs and others of the LEDs phosphor converted LEDs.

The output of the light emitting device may optionally be tuned by varying drive current to one or more of the LEDs, e.g., to one or more of the groups of LEDs.

In some embodiments, the first group has an average 1931 CIE x,y color point of $x_{blue}$, $y_{blue}$, the second group has an average 1931 CIE x,y color point of $x_{yellow-cyan}$, $y_{yellow-cyan}$, and the third group has an average 1931 CIE x,y color point of $x_{red}$, $y_{red}$, $1.10 \leq (x_{blue}+x_{yellow-cyan}+x_{red}) \leq 1.40$, $1.05 \leq (y_{blue}+y_{yellow-cyan}+y_{red}) \leq 1.25$, each of the LEDs in the first, second, and third groups has a color point for which the x value in the 1931 CIE x,y Chromaticity Diagram is greater than 0.15, and each of the LEDs in the first, second, and third groups has a color point for which the y value in the 1931 CIE x,y Chromaticity Diagram is greater than 0.15.

In some embodiments, $1.15 \leq (x_{blue}+x_{yellow-cyan}+x_{red}) \leq 1.40$, $1.10 \leq (y_{blue}+y_{yellow-cyan}+y_{red}) \leq 1.25$, each of the LEDs in the first, second, and third groups has a color point for which the x value in the 1931 CIE x,y Chromaticity Diagram is greater than 0.2, and each of the LEDs in the first, second, and third groups has a color point for which the y value in the 1931 CIE x,y Chromaticity Diagram is greater than 0.2.

In some embodiments, $1.20<(x_{blue}+x_{yellow-cyan}+x_{red})\leq 1.32$, $1.10\leq(y_{blue}+y_{yellow-cyan}+y_{red})\leq 1.20$, each of the LEDs in the first, second, and third groups has a color point for which the x value in the 1931 CIE x,y Chromaticity Diagram is greater than 0.2, and each of the LEDs in the first, second, and third groups has a color point for which the y value in the 1931 CIE x,y Chromaticity Diagram is greater than 0.2.

The color points $(x_{blue}, y_{blue})$, $(x_{yellow-cyan}, y_{yellow-cyan})$, and $(x_{red}, y_{red})$ of the primaries may span an absolute gamut in the CIE 1931 x,y Chromaticity Diagram of, for example, 0.01<gamut area<0.07, preferably 0.015<gamut area<0.055 and most preferred 0.02<gamut area<0.045.

In some embodiments, the LEDs of the first group each comprise a semiconductor diode structure configured to emit blue light and a first phosphor arranged to absorb blue light emitted by the semiconductor diode structure and in response emit light of a longer wavelength mixed with unabsorbed blue light, and the LEDs of the second group each comprise a semiconductor diode structure configured to emit blue light and a second phosphor arranged to absorb blue light emitted by the semiconductor diode structure and in response emit light of a longer wavelength. The LEDs of the third group each comprise a semiconductor diode structure configured to emit blue light, the first phosphor arranged to absorb blue light emitted by the semiconductor diode structure and in response emit light of a longer wavelength, and the second phosphor arranged to absorb blue light emitted by the semiconductor diode structure and in response emit light of a longer wavelength. The first phosphor may for example absorb blue light and emit red light, and the second phosphor absorb blue light and emit cyan light.

These and other embodiments, features and advantages of the present invention will become more apparent to those skilled in the art when taken with reference to the following more detailed description of the invention in conjunction with the accompanying drawings that are first briefly described.

BRIEF DESCRIPTION OF THE DRAWINGS

FIG. 1A is a table summarizing color characteristics of 4 example light emitting devices (Examples 1-4) discussed below, FIG. 1B is a table summarizing color characteristics of another 5 example light emitting devices (Examples 5-9) discussed below, and FIG. 1C is a table summarizing additional color characteristics of Examples 1-9.

FIG. 2F shows a table presenting additional characteristics of the example light emitting device.

FIG. 3F shows a table presenting additional characteristics of the example light emitting device.

FIG. 4F shows a table presenting additional characteristics of the example light emitting device.

FIG. 5F shows a table presenting additional characteristics of the example light emitting device.

FIG. 6F shows a table presenting additional characteristics of the example light emitting device.

FIG. 7F shows a table presenting additional characteristics of the example light emitting device.

FIG. 8F shows a table presenting additional characteristics of the example light emitting device.

DETAILED DESCRIPTION

Figure 2A:
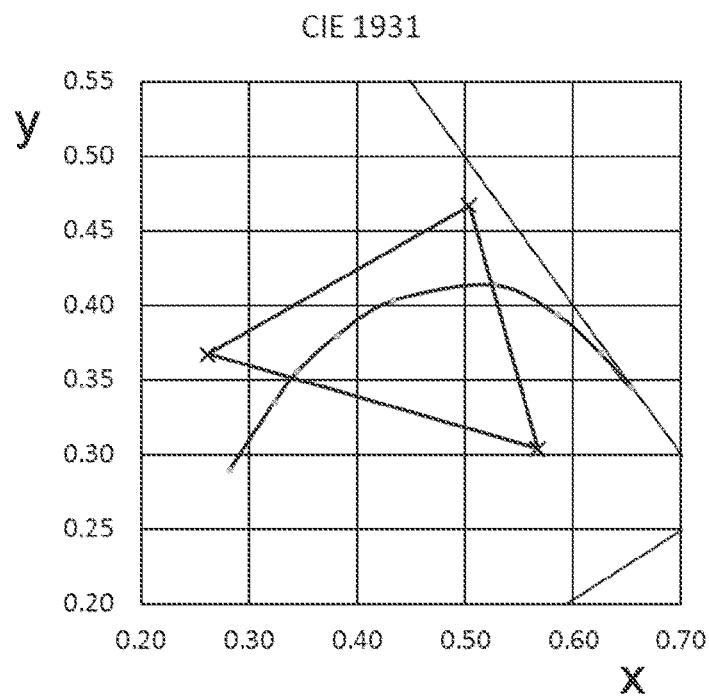
FIG. 2A, FIG. 2B, FIG. 2C, FIG. 2D, and FIG. 2E illustrate, respectively, a graph showing blue, cyan-yellow, and red color points and the Planckian locus, a graph of spectral power versus wavelength, a graph with current versus correlated color temperature (CCT), a graph of flux versus correlated color temperature, and a graph of color rendering index (CRI_Ra/R9) versus correlated color temperature for the light emitting device of Example 1.

The detailed description illustrates by way of example, not by way of limitation, the principles of the invention. This description describes several embodiments, adaptations, variations, alternatives and uses of the invention, including what is presently believed to be the best mode of carrying out the invention.

As summarized above, the light emitting devices disclosed herein comprise a first group of one or more LEDs each configured to emit light having a blue color point in the 1931 CIE x,y Chromaticity Diagram, a second group of one or more LEDs each configured to emit light having a cyan or yellow color point in the 1931 CIE x,y Chromaticity Diagram, and a third group of one or more LEDs each configured to emit light having a red color point in the 1931 CIE x,y Chromaticity Diagram.

The tables of FIGS. 1A-1B show nine examples for combinations of the three color points of these devices that satisfy the requirement summarized above that the first group has an average 1931 CIE x,y color point of $x_{blue}$, $y_{blue}$, the second group has an average 1931 CIE x,y color point of $x_{yellow-cyan}$, $y_{yellow-cyan}$, and the third group has an average 1931 CIE x,y color point of $x_{red}$, $y_{red}$, $1.10 \leq (x_{blue} + x_{yellow-cyan} + x_{red}) \leq 1.40$, $1.05 \leq (y_{blue} + y_{yellow-cyan} + y_{red}) \leq 1.25$, each of the LEDs in the first, second, and third groups has a color point for which the x value in the 1931 CIE x,y Chromaticity Diagram is greater than 0.15, and each of the LEDs in the first, second, and third groups has a color point for which the y value in the 1931 CIE x,y Chromaticity Diagram is greater than 0.15.

Subsets of Examples 1-9 satisfy the requirement summarized above that $1.15 \leq (x_{blue} + x_{yellow-cyan} + x_{red}) \leq 1.40$, $1.10 \leq (y_{blue} + y_{yellow-cyan} + y_{red}) \leq 1.25$, each of the LEDs in the first, second, and third groups has a color point for which the x value in the 1931 CIE x,y Chromaticity Diagram is greater than 0.2, and each of the LEDs in the first, second, and third groups has a color point for which the y value in the 1931 CIE x,y Chromaticity Diagram is greater than 0.2.

Subsets of Examples 1-9 satisfy the requirement summarized above that $1.20 < (x_{blue} + x_{yellow-cyan} + x_{red}) \leq 1.32$, $1.10 \leq (y_{blue} + y_{yellow-cyan} + y_{red}) \leq 1.20$, each of the LEDs in the first, second, and third groups has a color point for which the x value in the 1931 CIE x,y Chromaticity Diagram is greater than 0.2, and each of the LEDs in the first, second, and third groups has a color point for which the y value in the 1931 CIE x,y Chromaticity Diagram is greater than 0.2.

As shown in the tables of FIGS. 1A-1C, the color points ($x_{blue}$, $y_{blue}$), ($x_{yellow-cyan}$, $y_{yellow-cyan}$), and ($x_{red}$, $y_{red}$) of the primaries may span an absolute gamut in the CIE 1931 x,y Chromaticity Diagram of, for example, 0.01<gamut area<0.07, preferably 0.015<gamut area<0.055 and most preferred 0.02<gamut area<0.045.

In the tables of FIGS. 1A-1B, R CP, Y CP, and B CP refer respectively to the red color point, the cyan or yellow color point, and the blue color point. Any of these color points may be generated using one or more LEDs, for example one or more phosphor-converted LEDs. The color points shown in the tables of FIGS. 1A-1B are averages of color points within a group of LEDs (i.e., within the first, second, or third groups referred to above). The LEDs for a particular group form a color box in a chromaticity diagram, with the average color point for the group falling within the color box. The table of FIG. 1C shows, for each of Examples 1-9, the minimum and maximum values for ($x_{blue} + x_{yellow-cyan} + x_{red}$), the minimum and maximum values for ($y_{blue} + y_{yellow-cyan} + y_{red}$), the minimum and maximum values of gamut area, and the average (center value) of gamut area.

Typically all of the LEDs in the first group of LEDs are phosphor converted LEDs having the same configuration; all of the LEDs in the second group of LEDS are phosphor converted LEDS having the same configuration, but different from that of the first group; and all of the phosphor converted LEDS in the third group are phosphor converted LEDS having the same configuration, but different from that of the first and second groups. Typically all of these phosphor converted LED configurations comprise a semiconductor diode structure configured to emit blue light, and one or more phosphors that absorb the blue light and in response emit light of a longer wavelength.

The LEDs of the first, second, and third groups may produce desaturated output light as a result of phosphor emission combining with unabsorbed blue light from the semiconductor diode structure, or as a result of the spectral breadth of emission from the phosphor, or for both reasons. Typically, the output from the LEDs in the first group is a desaturated bluish white, with about 50% of the blue light emitted from a semiconductor diode structure converted by a phosphor to a longer wavelength (for example, to a red wavelength).

As noted above in the background section, conventional devices may combine multiple phosphors with a single blue emitting diode to generate a desired white light output directly, with each phosphor converted LED producing essentially the same output. In contrast, in the light emitting devices disclosed herein the phosphors used to generate a desired (for example, white) light output are distributed among three or more groups of LEDS, with the different groups emitting light at different color points, such that the combined emission from the three different groups provides the desired (e.g., white) light output.

In some embodiments in which two different phosphors are distributed among three groups of LEDS, the distribution of phosphors can be described as:

$$\text{LED group 1} = \text{blue die} + a * \text{phosphor 1};$$

$$\text{LED group 2} = \text{blue die} + b * \text{phosphor 2; and}$$

$$\text{LED group 3} = \text{blue die} + c * \text{phosphor 1} + d * \text{phosphor 2};$$

where the coefficients a, b, c, and d abstractly indicate the amount of the indicated phosphor used. These coefficients may be selected such that the phosphor absorbs and converts a desired fraction (up to 100%) of the blue semiconductor diode emission to phosphor emission.

The LEDs will together give a color point and flux, which can be described in CIE1931 color space with coordinates (X,Y,Z), where Y is equal to the luminous flux, and the color point (x,y) is then derived as x=X/(X+Y+Z) and y=Y/(X+Y+Z). The X,Y,Z coordinates will be function of the blue die wavelength λ, and the phosphor loading (a,b,c,d).

With the system being defined by (λ, a,b,c,d), there are three degrees of freedom, which can be used to adjust the flux Y, color rendering, and for example, also adjust the flux value at another color point (with a different driving ratio). In effect, in such embodiments the light emitting device includes one LED for each desired phosphor, plus one "remainder" LED. The color points of the LEDs may be selected such that the sum of the luminous flux at the desired color point and color rendering requirement is maximized. The luminous efficacy will predominantly be a function of the amount of phosphor (loading ratio).

In one embodiment, phosphor 1 absorbs blue light and emits red light, and phosphor 2 absorbs blue light and emits cyan light.

Given the guidance provided in this specification as to desired color points for the disclosed light emitting devices, one of ordinary skill in the art can choose suitable phosphor materials to combine with blue emitting LEDs to construct the disclosed devices. Generally, any suitable phosphor or wavelength converting materials may be used. For example, a predominantly white-emitting LED could result from pairing a blue-emitting LED with a wavelength converting material such as $Y_3Al_5O_{12}:Ce^{3+}$ that absorbs some of the blue light and emits yellow light. Other examples of phosphors that may be used include aluminum garnet phosphors with the general formula $(Lu_{1-x-y-a-b}Y_xGd_y)_3(Al_{1-z}Ga_z)_5O_{12}:Ce_aPr_b$ wherein $0<x<1$, $0<y<1$, $0<z\le 0.1$, $0<a\le 0.2$ and $0<b\le 0.1$, such as $Lu_3Al_5O_{12}:Ce^{3+}$ and $Y_3Al_5O_{12}:Ce^{3+}$ which emit light in the yellow-cyan range; and $(Sr_{1-x-y}Ba_xCa_y)_{2-z}Si_{5-a}Al_aN_{8-a}O_a:Eu^{2+}$ wherein $0\le a<5$, $0<x\le 1$, $0\le y\le 1$, and $0<z\le 1$, such as $Sr_2Si_5N_8:Eu^{2+}$, which emit light in the red range. Other cyan, yellow, and red emitting phosphors may also be suitable, including $(Sr_{1-a-b}Ca_bBa_c)Si_xN_yO_z:Eu_a^{2+}$ ($a$=0.002-0.2, $b$=0.0-0.25, $c$=0.0-0.25, $x$=1.5-2.5, $y$=1.5-2.5, $z$=1.5-2.5) including, for example, $SrSi_2N_2O_2:Eu^{2+}$; $(Sr_{1-u-v-x}Mg_uCa_vBa_x)(Ga_{2-y-z}Al_yIn_z S_4):Eu^{2+}$ including, for example, $SrGa_2S_4:Eu^{2+}$; $Sr_{1-x}Ba_xSiO_4:Eu^{2+}$; and $(Ca_{1-x}Sr_x)S:Eu^{2+}$ wherein $0<x<1$ including, for example, $CaS:Eu^{2+}$ and $SrS:Eu^{2+}$. Examples of suitable yellow/cyan emitting phosphors include but are not limited to $Lu_{3-x-y}M'_yAl_{5-z}A_zO_{12}:Ce_x$ where M=Y, Gd, Tb, Pr, Sm, Dy; A=Ga, Sc; and ($0<x\le 0.2$); $Ca_{3-x-y}M'_ySc_{2-z}A_zSi_3O_{12}:Ce_x$ where M=Y, Lu; A=Mg, Ga; and ($0<x\le 0.2$); $Ba_{1-x-y}M_ySiO_4:Eu_x$ where M=Sr, Ca, Mg and ($0<x\le 0.2$); $Ba_{2-x-y-z}M_yK_zSi_{1-z}P_zO_4Eu_x$ where M=Sr, Ca, Mg and ($0<x\le 0.2$); $Sr_{1-x-y}M_yAl_{2-z}Si_zO_{4-z}N_z:Eu_x$ where M=Ba, Ca, Mg and ($0<x\le 0.2$); $M_{1-x}Si_2O_2N_2:Eu_x$ where M=Sr, Ba, Ca, Mg and ($0<x\le 0.2$); $M_{3-x}Si_6O_9N_4:Eu_x$ where M=Sr, Ba, Ca, Mg and ($0<x\le 0.2$); $M_{3-x}Si_6O_{12}N_2:Eu_x$ where M=Sr, Ba, Ca, Mg and ($0<x\le 0.2$); $Sr_{1-x-y}M_yGa_{2-z}Al_zS_4:Eu_x$ where M=Ba, Ca, Mg and ($0<x\le 0.2$); $Ca_{1-x-y-z}M_zS:Ce_xA_y$ where M=Ba, Sr, Mg; A=K, Na, Li; and ($0<x\le 0.2$); $Sr_{1-x-z}M_zAl_{1+y}So_{4.2-y}N_{7-y}O_{0.4+y}:Eu_x$ where M=Ba, Ca, Mg and ($0<x\le 0.2$); $Ca_{1-x-y-z}M_ySc2O4:CexAz$ where M=Ba, Sr, Mg; A=K, Na, Li; and ($0<x\le 0.2$); $Mx-zSi6_{-y-2x}Al_{y+2x}O_yN_{8-y}:Eu_z$ where M=Ca, Sr, Mg and ($0<x\le 0.2$); and $Ca_{8-x-y}M_yMgSiO_4Cl_2:Eu_x$ where M=Sr, Ba and ($0<x\le 0.2$). Examples of suitable red emitting phosphors include $Ca_{1-x-z}M_zS:Eu_x$ where M=Ba, Sr, Mg, Mn and ($0<x\le 0.2$); $Ca_{1-x-y}M_ySi_{1-z}Al_{1+z}N_{3-z}O_z:Eu_x$ where M=Sr, Mg, Ce, Mn and ($0<x\le 0.2$); $Mg_4Ge_{1-x}O_5F:Mn_x$ where ($0<x\le 0.2$); $M_{2-x}Si_{5-y}Al_yN_{8-y}O_y:Eu_x$ where M=Ba, Sr, Ca, Mg, Mn and ($0<x\le 0.2$); $Sr_{1-x-y}M_ySi_{4-z}Al_{1+z}N_{7-z}O_z:Eu_x$ where M=Ba, Ca, Mg, Mn and ($0<x\le 0.2$); and $Ca_{1-x-y}M_ySiN_2:Eu_x$ where M=Ba, Sr, Mg, Mn and ($0<x\le 0.2$).

In some embodiments, the phosphor includes portions with inert particles rather than phosphor, or with phosphor crystals without activating dopant, such that those portions do not absorb and emit light. For example, $SiN_x$ may be included as inert particles. The activating dopant in the ceramic phosphor may also be graded, for example such that the phosphors closest to a surface have the highest dopant concentration. As the distance from the surface increases, the dopant concentration in the phosphor decreases. The dopant profile may take any shape including, for example, a linear, step-graded, or a power law profile, and may include multiple or no regions of constant dopant concentration.

Wavelength converter phosphors can be used in conjunction with various types of LEDs. Unconverted light emitted by the LED can be part of the final spectrum of light extracted from the structure, though it need not be. Examples of common combinations include a blue-emitting LED combined with a yellow-emitting wavelength converting phosphor, a blue-emitting LED combined with cyan- and red-emitting wavelength converting phosphor, a UV-emitting LED combined with blue- and yellow-emitting wavelength converting phosphors, and a UV-emitting LED combined with blue-, cyan-, and red-emitting wavelength converting phosphors. Wavelength converting phosphors emitting other colors of light may be added to tailor the spectrum of light extracted from the structure.

Binders can be used for holding together and/or attaching wavelength converting materials to a substrate. The binders can be organic, inorganic, or organic/inorganic. Organic binders can be, for example, acrylate or nitrocellulose. An organic/inorganic binder can be, for example, silicone. Silicone can be methyl or phenyl silicone, fluorosilicones, or other suitable high refractive index silicones. Inorganic binders can include sol-gel (e.g., a sol-gel of TEOS or MTMS) or liquid glass (e.g., sodium silicate or potassium silicate), also known as water glass, that have a low viscosity and are able to saturate porous substrates.

In some embodiments binders can include fillers to adjust physical or optical properties. Fillers can include inorganic nanoparticles, silica, glass particles or fibers, or other materials able to increase refractive index. In some embodiments, fillers can include materials that improve optical performance, materials that encourage scattering, and/or materials that improve thermal performance.

The LED die and wavelength converter may be formed to be square, rectangular, polygonal, hexagonal, circular, elliptical, or any other suitable shape. In certain embodiments, the wavelength converter phosphor can be a ceramic that can be singulated before positioning near an LED die, while in other embodiments it can be singulated after attachment to an LED. The wavelength converter phosphor can be directly attached to an LED by coating, or alternatively disposed in close proximity to an LED. For example, it can be separated from an LED by an inorganic layer, a polymer sheet, a thick adhesive layer, a small air gap, or any other suitable structure. The spacing between LED and the wavelength converter phosphor may be, for example, less than 500 microns in some embodiments or on the order of millimeters in other embodiments.

In examples 1-5 described below, LEDs may comprise a blue emitting semiconductor diode structure combined with one, two, or more garnet phosphor materials of the general formula $[Ce_xLu_aY_{(1-a-x)}]_3[Ga_bAl_{(1-b)}]_5O_{12}$ with $0.01<x<0.06$, $0<a<1-x$, $0<b<0.6$, with a first red phosphor material (nitride A) of the general formula $(Sr_c,Eu_y,Ca_{(1-c-y)})AlSiN_3$ with $0.001<y<0.02$, $0.5<c<0.95$, and/or with a second red phosphor ("nitride B") material of the general formula $Eu_zSr_{(1-z)}LiAl_3N_4$, with $0.003<z<0.015$. The nitride A phosphor material can also be replaced (or combined) with a 2-5-8 phosphor material of the general formula $[Eu_y,Ba_d,Sr_{(1-y-d)}]_2Si_5N_8$, with $0.003<y<0.03$, $0.2<d<0.6$.

Example 1

Figure 2B:
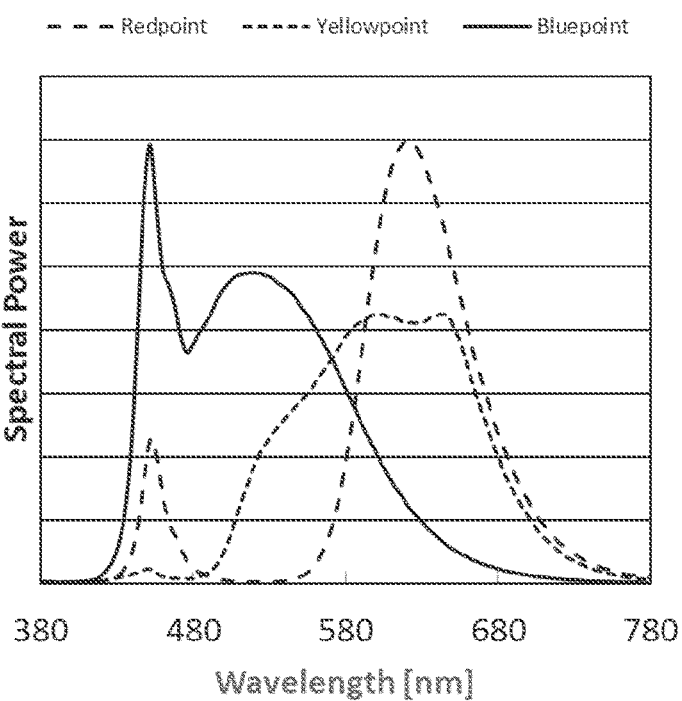
Figure 2C:
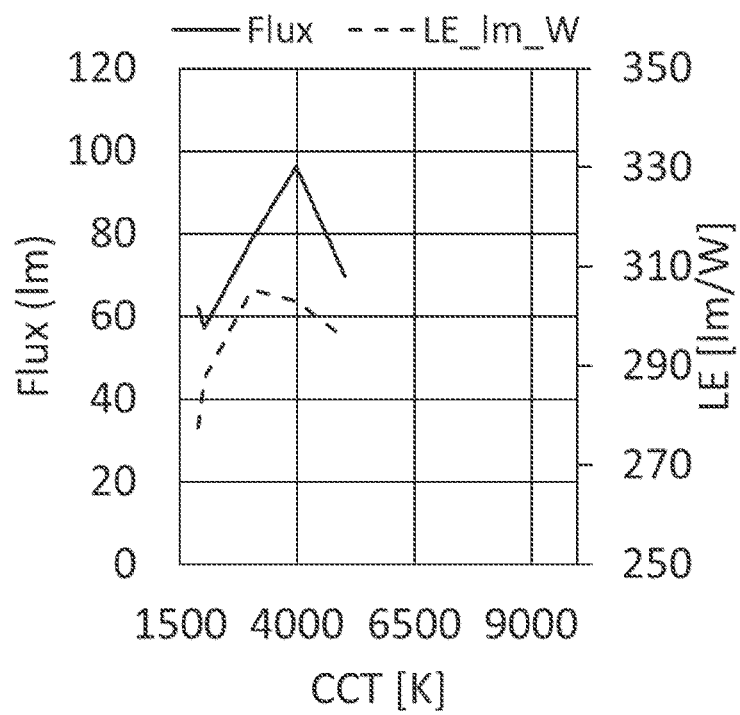
Figure 2D:
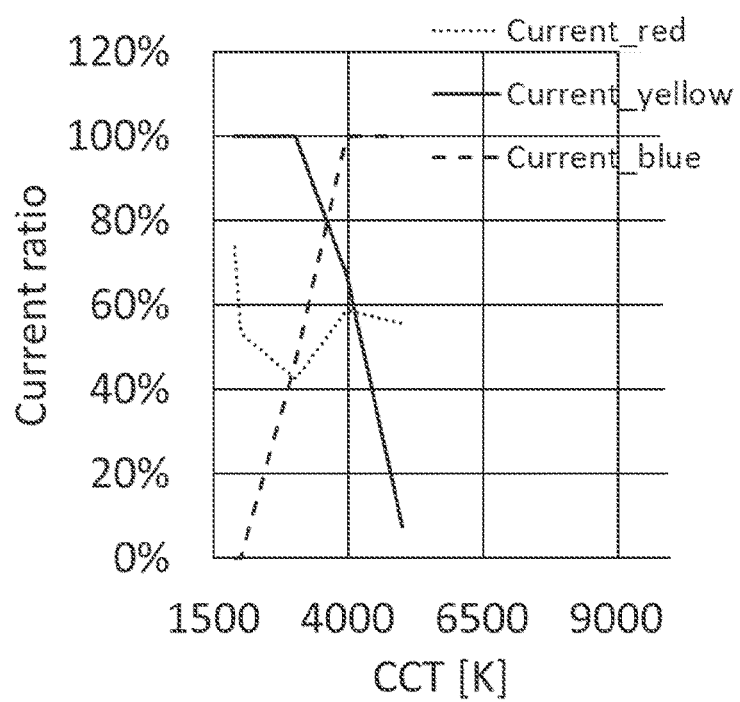
Figure 2E:
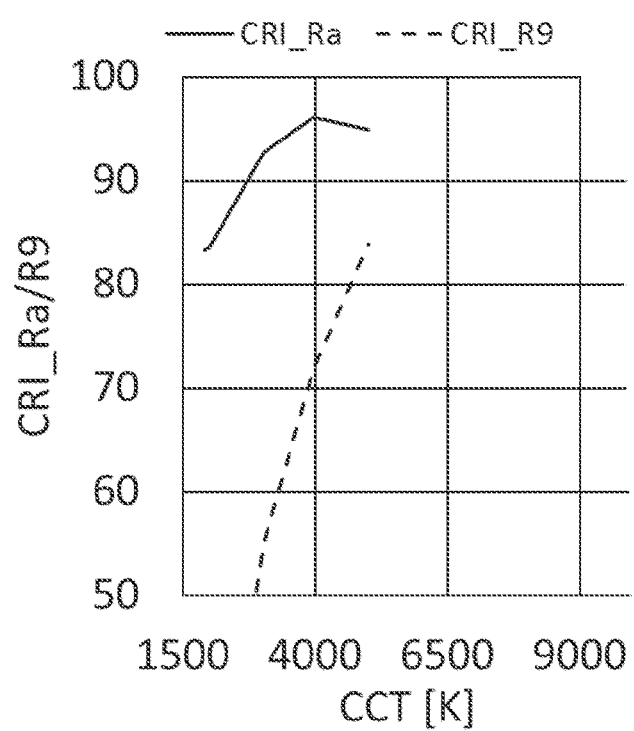

FIG. 2A shows the blue, cyan-yellow, and red color points for this example on a chromaticity diagram. FIG. 2B shows the emission spectra of the blue, cyan-yellow, and red LED groups. In this example, each LED in the first group (blue color point) comprises a blue emitting semiconductor diode in combination with the garnet phosphor in silicone with $x$=0.02, $a$=0, $b$=0.42, using a phosphor mass of 10 percent phosphor of the silicone mass. Each LED in the second group (yellow-cyan color point) comprises a blue emitting semiconductor diode in combination with 87% (mass) garnet phosphor with $x$=0.025, $a$=1-0.025, $b$=0, 13% (mass) garnet phosphor with $x$=0.02, $a$=0, $b$=0, Nitride A (99%) with $y$=0.005, $c$=0.88, and Nitride B (1%) with $z$=0.007. The weight ratio of garnets to nitrides=121, with a phosphor mass of 190 percent of the silicone mass. Each LED in the third group (red color point) comprises a blue emitting semiconductor diode in combination with garnet phosphor with x=0.02, a=0, b=0, Nitride A (83%) with y=0.005, c=0.88, and Nitride B (17%) with z=0.007. The weight ratio of garnets to nitrides=0.52, with a phosphor mass of 132 percent of the silicone mass. FIG. 2C shows variation of Flux and LE with CCT, FIG. 2D shows variation of CCT with driving current to the blue, cyan-yellow, and red LED groups, and FIG. 2E shows variation of color rendering parameters Ra and R9 with CCT. Characteristics of the specific LED and phosphor combinations, as well as other operating characteristics are shown in the table of FIG. 2F.

Example 2

Figure 3A:
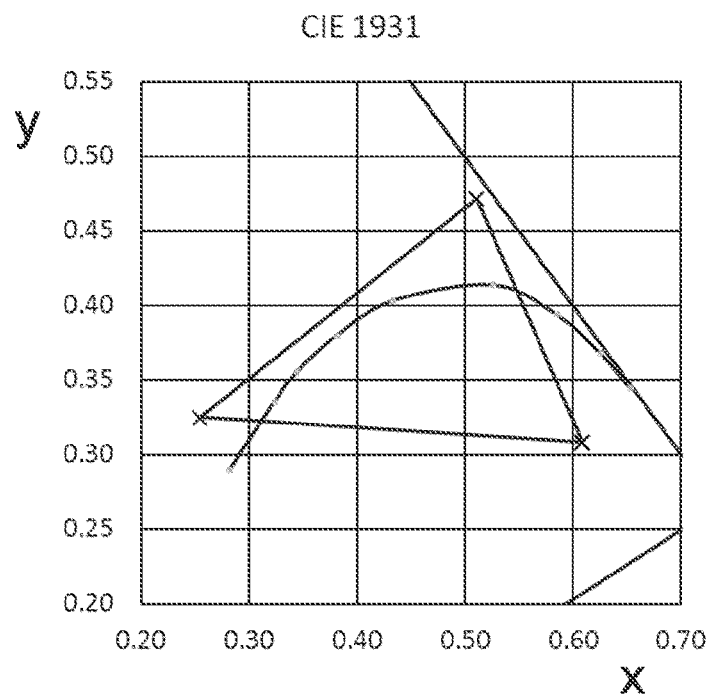
FIG. 3A, FIG. 3B, FIG. 3C, FIG. 3D, and FIG. 3E illustrate, respectively, a graph showing blue, cyan-yellow, and red color points and the Planckian locus, a graph of spectral power versus wavelength, a graph with current versus correlated color temperature (CCT), a graph of flux versus correlated color temperature, and a graph of color rendering index (CRI_Ra/R9) versus correlated color temperature for the light emitting device of Example 2.
Figure 3B:
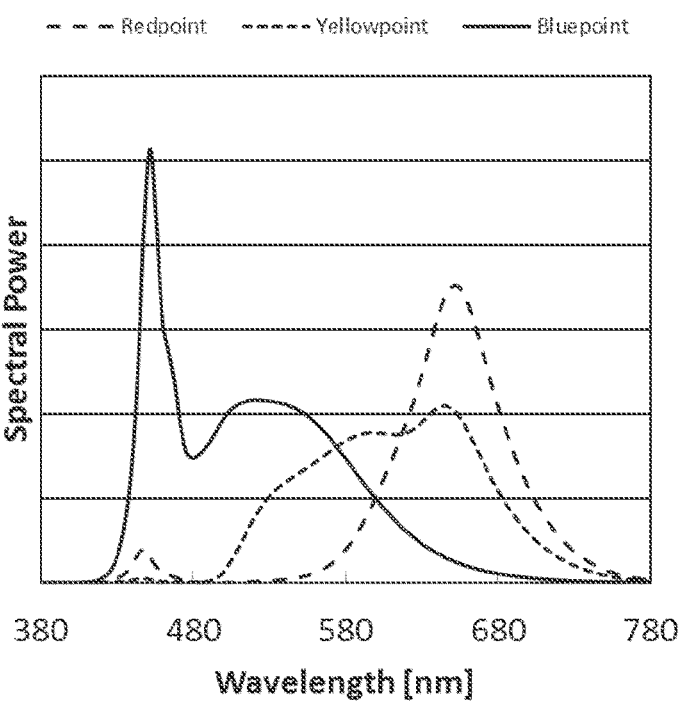
Figure 3C:
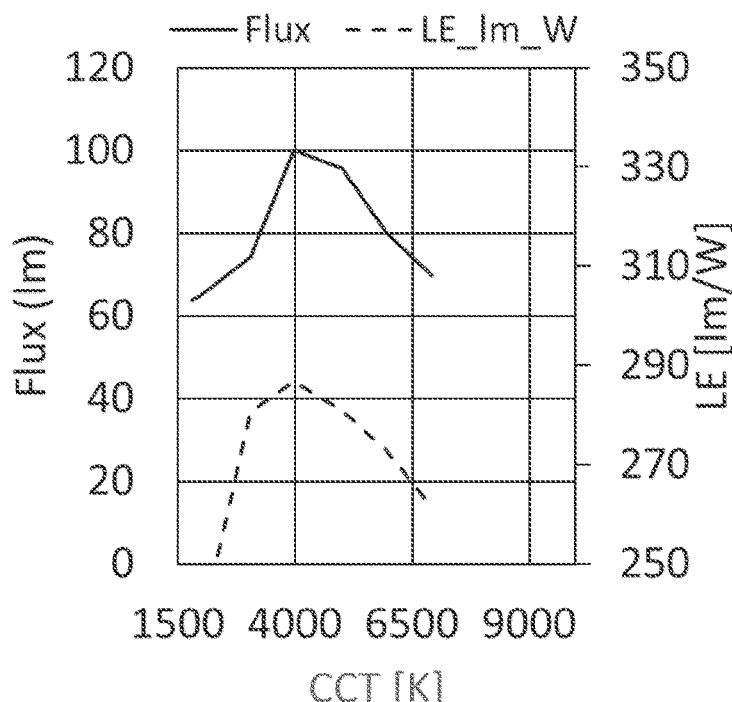
Figure 3D:
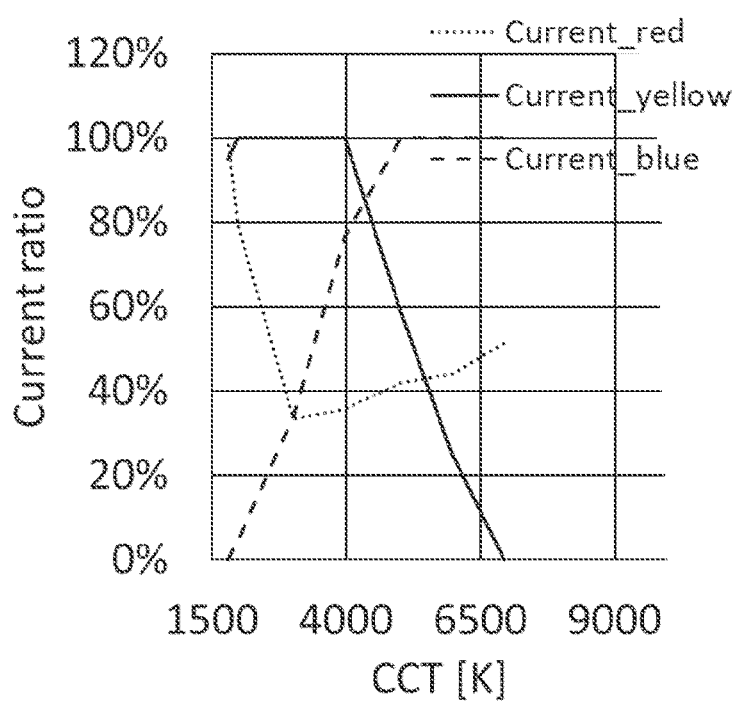
Figure 3E:
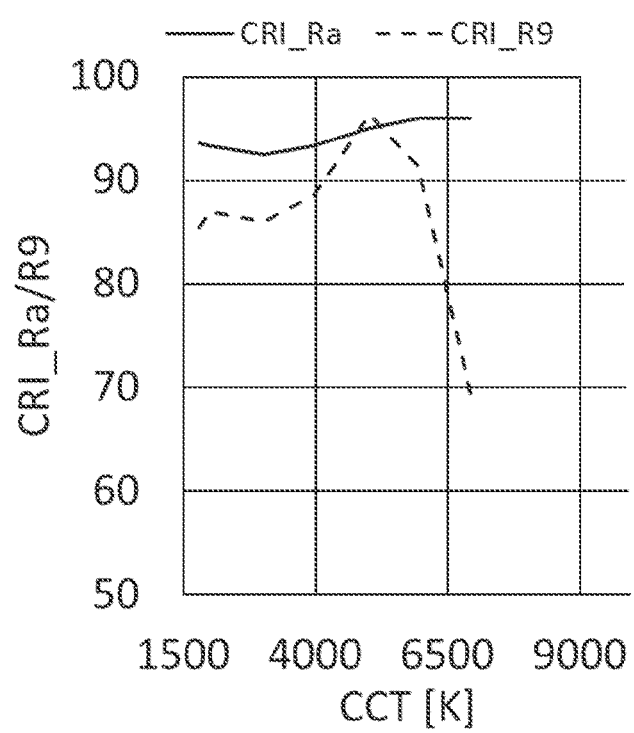

FIG. 3A shows the blue, cyan-yellow, and red color points for this example on a chromaticity diagram. FIG. 3B shows the emission spectra of the blue, cyan-yellow, and red LED groups. In this example, each LED in the first group (blue color point) comprises a blue emitting semiconductor diode in combination with the garnet phosphor in silicone with x=0.02, a=0, b=0.42, using a phosphor mass of 8.5 percent phosphor of the silicone mass. Each LED in the second group (yellow-cyan color point) comprises a blue emitting semiconductor diode in combination with 87% (mass) garnet phosphor with x=0.025, a=1-0.025, b=0, 13% (mass) garnet phosphor with x=0.02, a=0, b=0, Nitride A (99%) with y=0.005, c=0.88, and Nitride B (1%) with z=0.007. The weight ratio of garnets to nitrides=121, with a phosphor mass of 190 percent of the silicone mass. Each LED in the third group (red color point) comprises a blue emitting semiconductor diode in combination with garnet phosphor with x=0.02, a=0, b=0, Nitride A (83%) with y=0.005, c=0.88, and Nitride B (17%) with z=0.007. The weight ratio of garnets to nitrides=0.07, with a phosphor mass of 112 percent of the silicone mass. FIG. 3C shows variation of Flux and LE with CCT, FIG. 3D shows variation of CCT with driving current to the blue, cyan-yellow, and red LED groups, and FIG. 3E shows variation of color rendering parameters Ra and R9 with CCT. Characteristics of the specific LED and phosphor combinations, as well as other operating characteristics are shown in the table of FIG. 3F.

Example 3

Figure 4A:
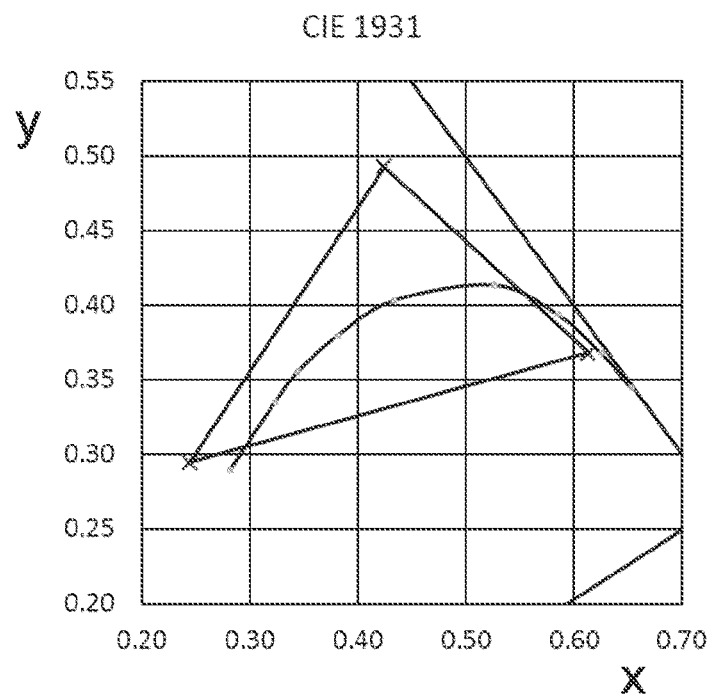
FIG. 4A, FIG. 4B, FIG. 4C, FIG. 4D, and FIG. 4E illustrate, respectively, a graph showing blue, cyan-yellow, and red color points and the Planckian locus, a graph of spectral power versus wavelength, a graph with current versus correlated color temperature (CCT), a graph of flux versus correlated color temperature, and a graph of color rendering index (CRI_Ra/R9) versus correlated color temperature for the light emitting device of Example 3.
Figure 4B:
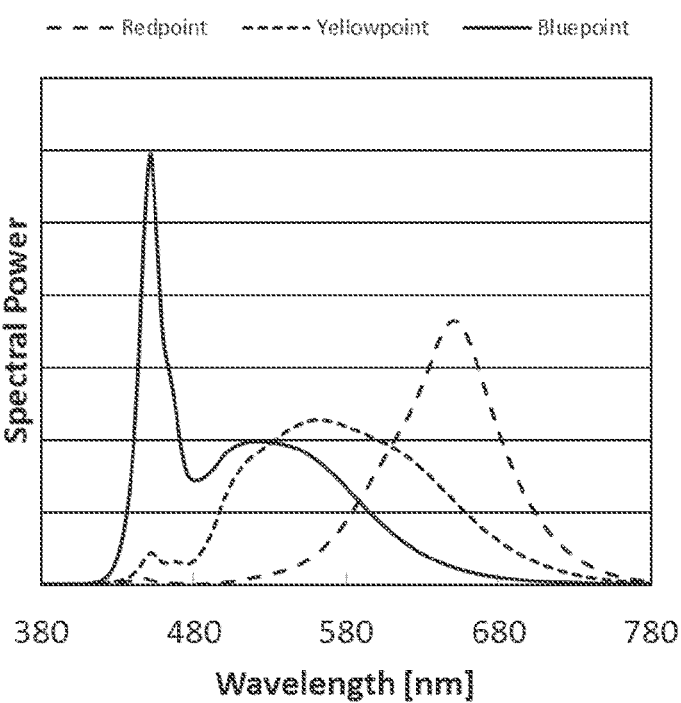
Figure 4C:
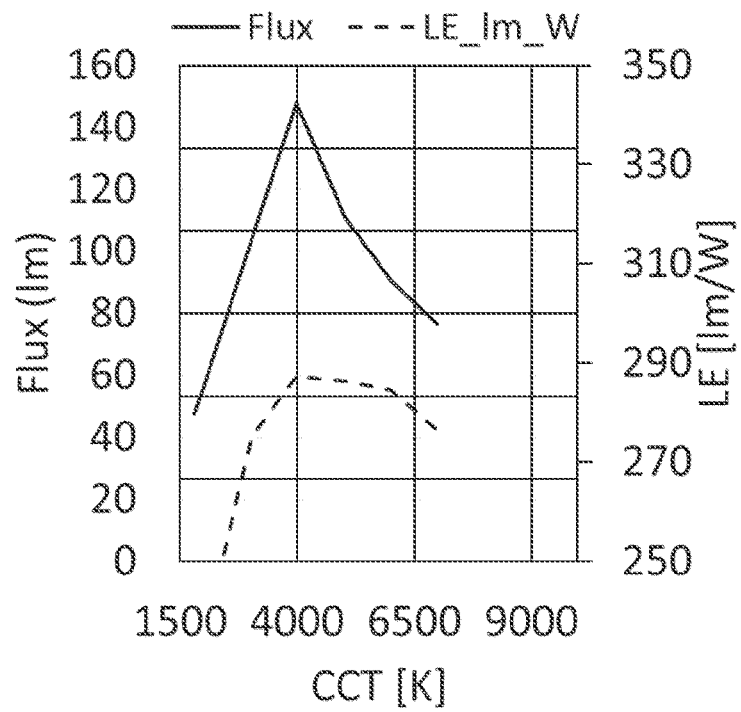
Figure 4D:
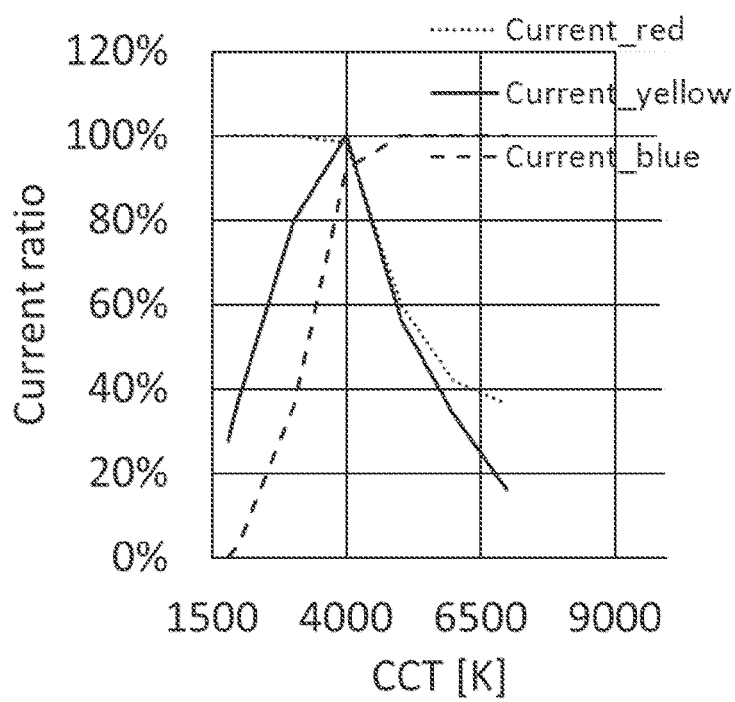
Figure 4E:
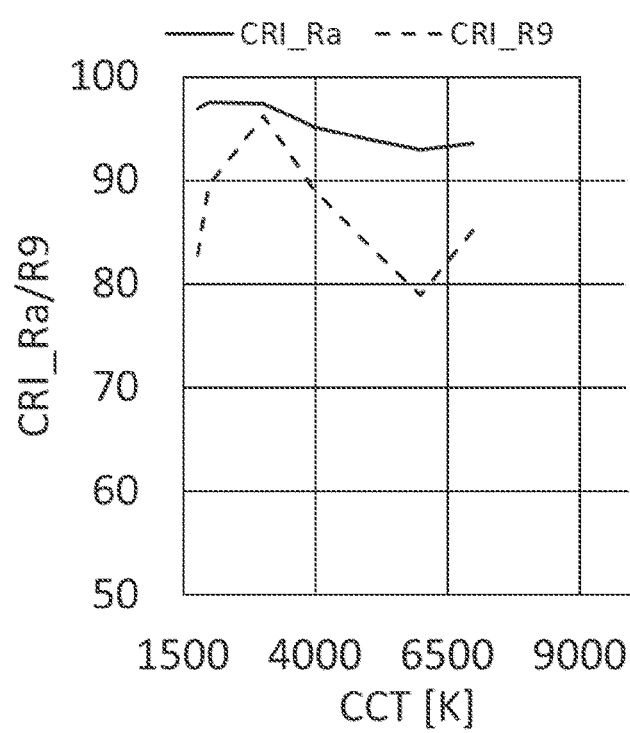

FIG. 4A shows the blue, cyan-yellow, and red color points for this example on a chromaticity diagram. FIG. 4B shows the emission spectra of the blue, cyan-yellow, and red LED groups. In this example, each LED in the first group (blue color point) comprises a blue emitting semiconductor diode in combination with the garnet phosphor in silicone with x=0.02, a=0, b=0.42, using a phosphor mass of 7.4 percent phosphor of the silicone mass. Each LED in the second group (yellow-cyan color point) comprises a blue emitting semiconductor diode in combination with 87% (mass) garnet phosphor with x=0.025, a=1-0.025, b=0, 13% (mass) garnet phosphor with x=0.02, a=0, b=0, Nitride A (99%) with y=0.005, c=0.88, and Nitride B (1%) with z=0.007. The weight ratio of garnets to nitrides=121, with a phosphor mass of 190 percent of the silicone mass. Each LED in the third group (red color point) comprises a blue emitting semiconductor diode in combination with garnet phosphor with x=0.02, a=0, b=0, Nitride A (83%) with y=0.005, c=0.88, and Nitride B (17%) with z=0.007. The weight ratio of garnets to nitrides=0.07, with a phosphor mass of 132 percent of the silicone mass. FIG. 4C shows variation of Flux and LE with CCT, FIG. 4D shows variation of CCT with driving current to the blue, cyan-yellow, and red LED groups, and FIG. 4E shows variation of color rendering parameters Ra and R9 with CCT. Characteristics of the specific LED and phosphor combinations, as well as other operating characteristics are shown in the table of FIG. 4F.

Example 4

Figure 5A:
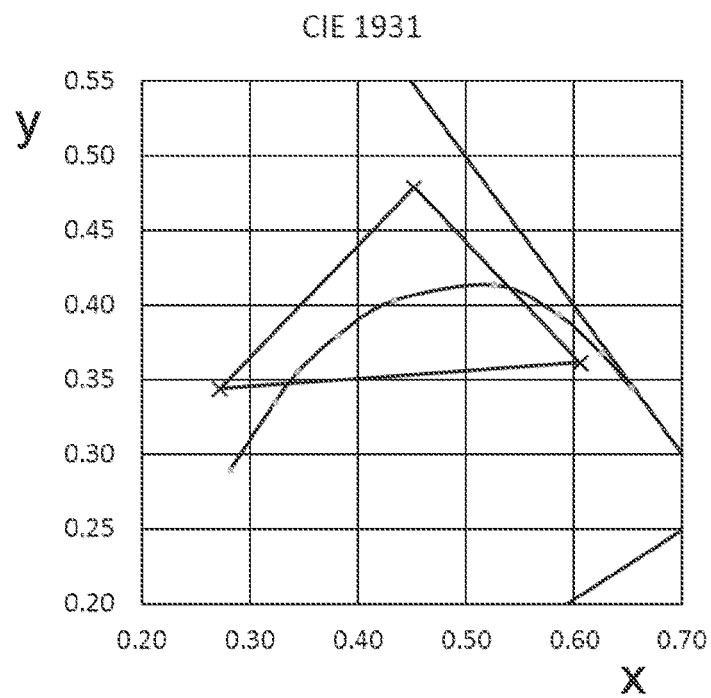
FIG. 5A, FIG. 5B, FIG. 5C, FIG. 5D, and FIG. 5E illustrate, respectively, a graph showing blue, cyan-yellow, and red color points and the Planckian locus, a graph of spectral power versus wavelength, a graph with current versus correlated color temperature (CCT), a graph of flux versus correlated color temperature, and a graph of color rendering index (CRI_Ra/R9) versus correlated color temperature for the light emitting device of Example 4.
Figure 5B:
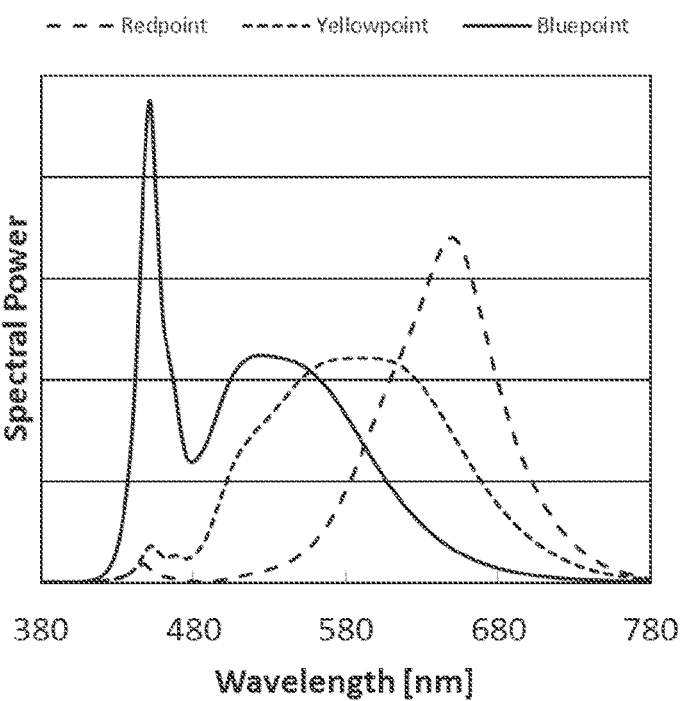
Figure 5C:
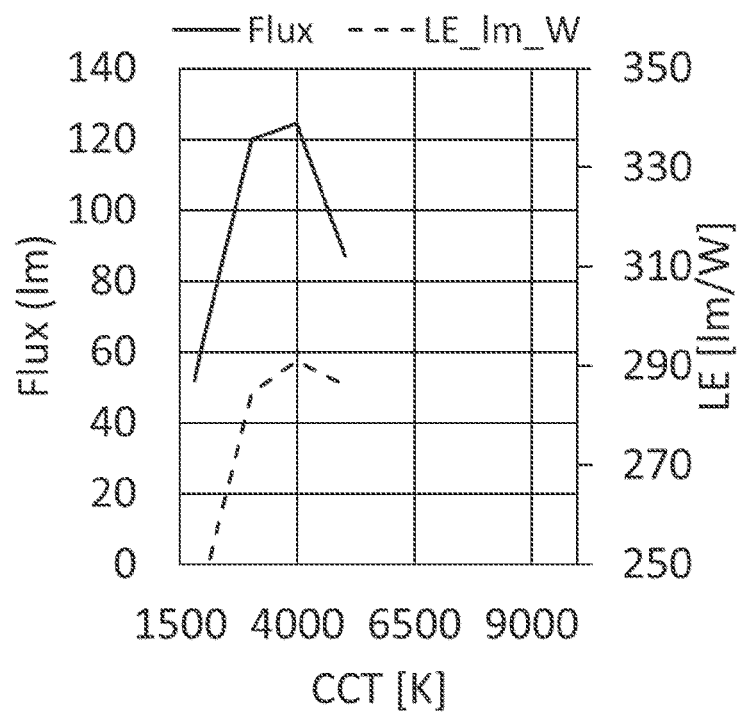
Figure 5D:
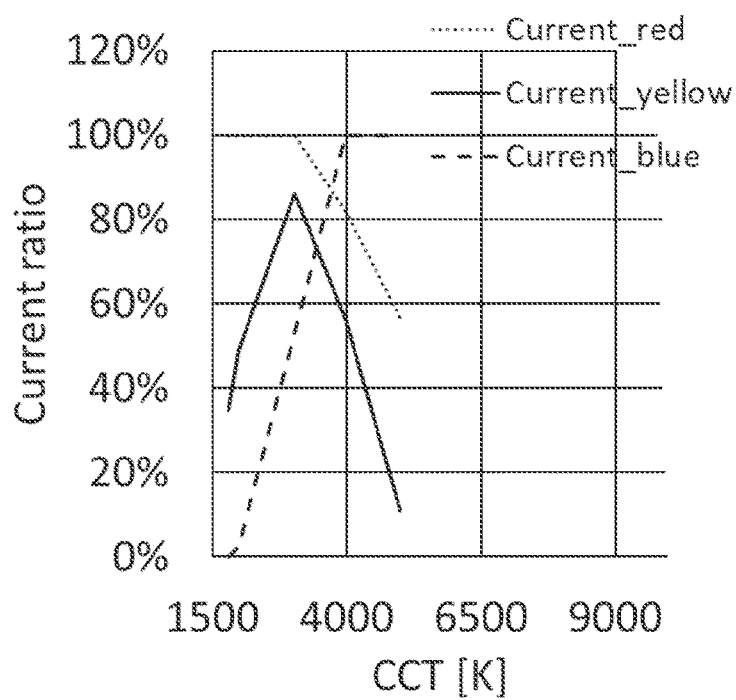
Figure 5E:
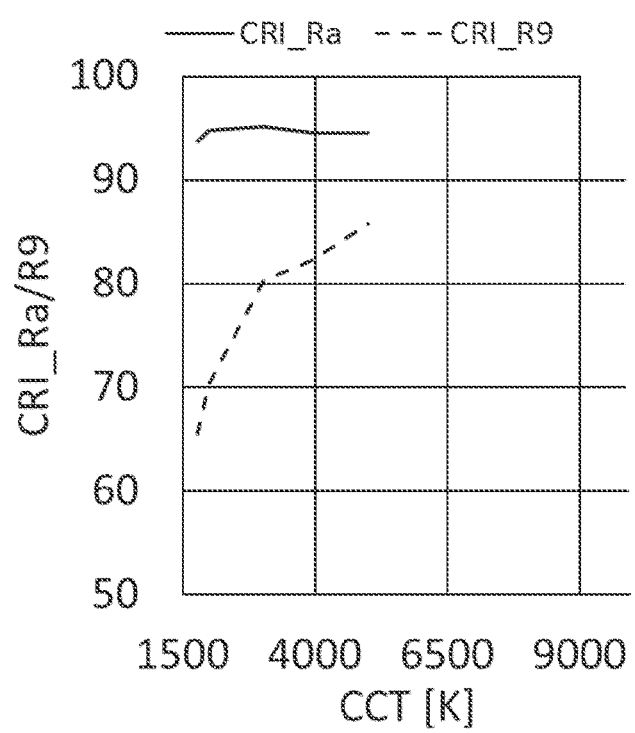

FIG. 5A shows the blue, cyan-yellow, and red color points for this example on a chromaticity diagram. FIG. 5B shows the emission spectra of the blue, cyan-yellow, and red LED groups. In this example, each LED in the first group (blue color point) comprises a blue emitting semiconductor diode in combination with the garnet phosphor in silicone with x=0.02, a=0, b=0.36, using a phosphor mass of 8 percent phosphor of the silicone mass. Each LED in the second group (yellow-cyan color point) comprises a blue emitting semiconductor diode in combination with 87% (mass) garnet phosphor with x=0.025, a=1-0.025, b=0, 13% (mass) garnet phosphor with x=0.02, a=0, b=0, Nitride A (99%) with y=0.005, c=0.88. The weight ratio of garnets to nitrides=82.7, with a phosphor mass of 189 percent of the silicone mass. Each LED in the third group (red color point) comprises a blue emitting semiconductor diode in combination with garnet phosphor with x=0.02, a=0, b=0, Nitride A (89%) with y=0.005, c=0.88, and Nitride B (11%) with z=0.007. The weight ratio of garnets to nitrides=0.3, with a phosphor mass of 131 percent of the silicone mass. FIG. 5C shows variation of Flux and LE with CCT, FIG. 5D shows variation of CCT with driving current to the blue, cyan-yellow, and red LED groups, and FIG. 5E shows variation of color rendering parameters Ra and R9 with CCT. Characteristics of the specific LED and phosphor combinations, as well as other operating characteristics are shown in the table of FIG. 5F.

Example 5

Figure 6A:
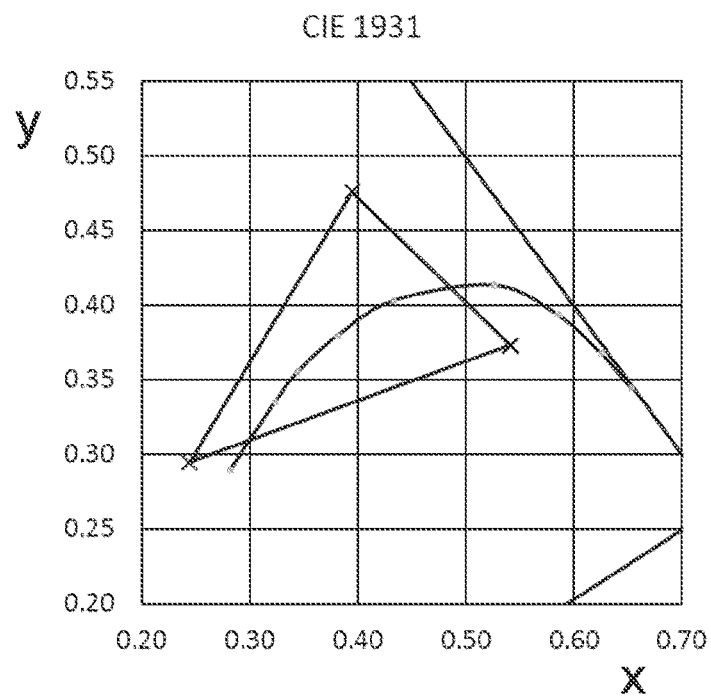
FIG. 6A, FIG. 6B, FIG. 6C, FIG. 6D, and FIG. 6E illustrate, respectively, a graph showing blue, cyan-yellow, and red color points and the Planckian locus, a graph of spectral power versus wavelength, a graph with current versus correlated color temperature (CCT), a graph of flux versus correlated color temperature, and a graph of color rendering index (CRI_Ra/R9) versus correlated color temperature for the light emitting device of Example 5.
Figure 6B:
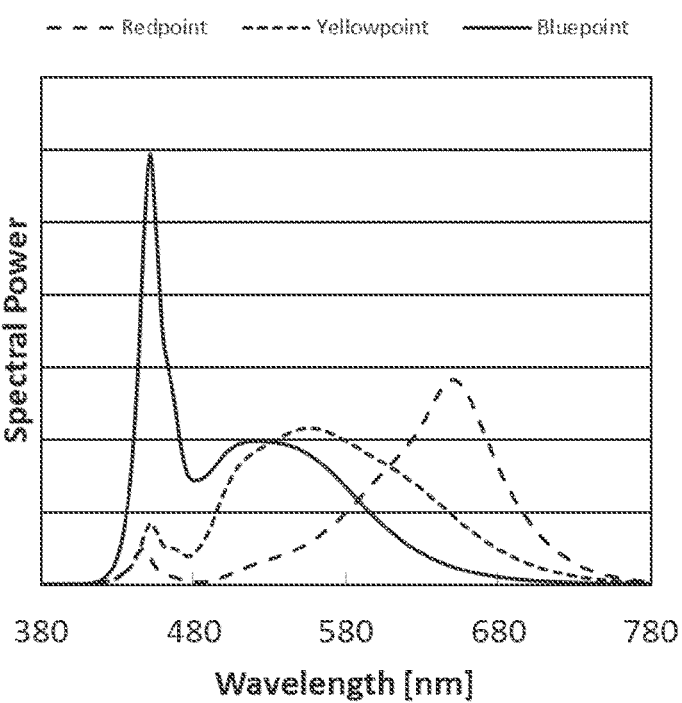
Figure 6C:
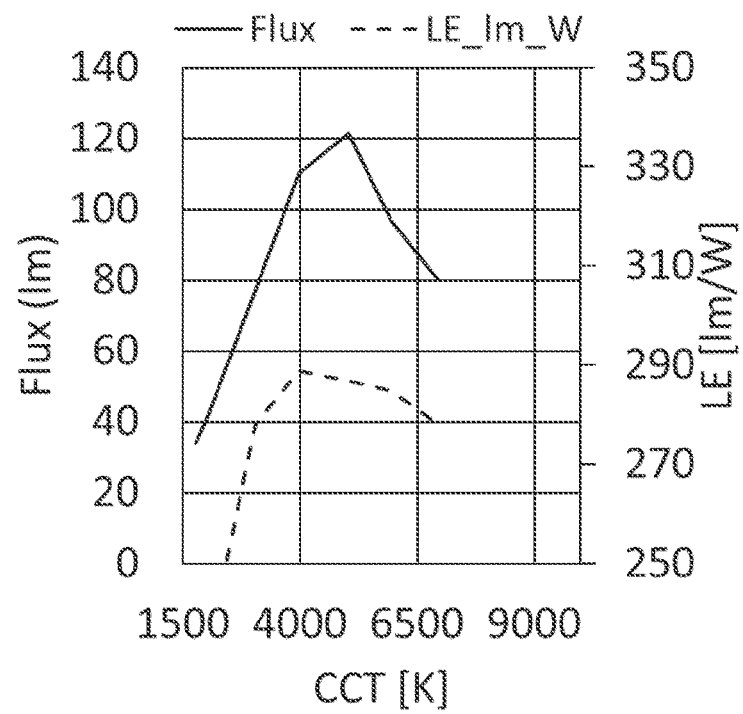
Figure 6D:
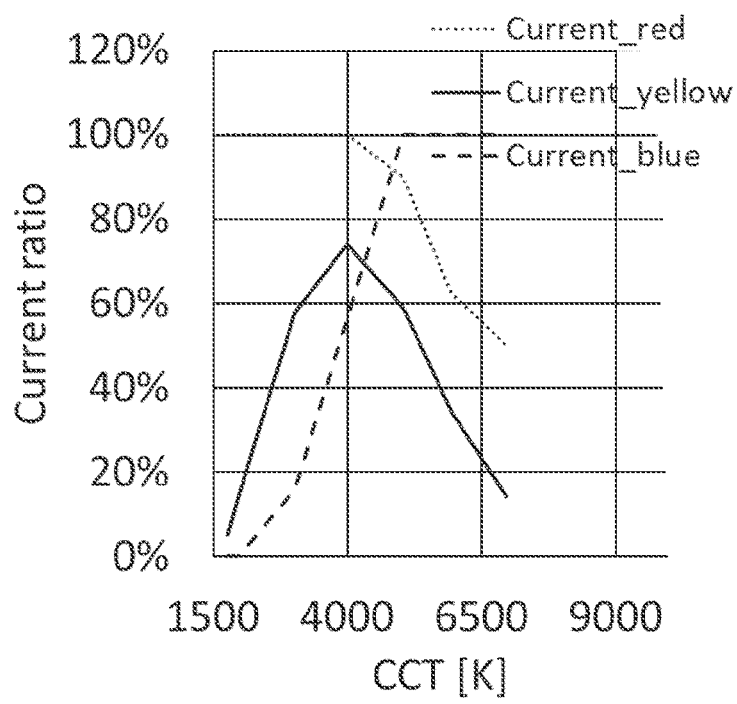
Figure 6E:
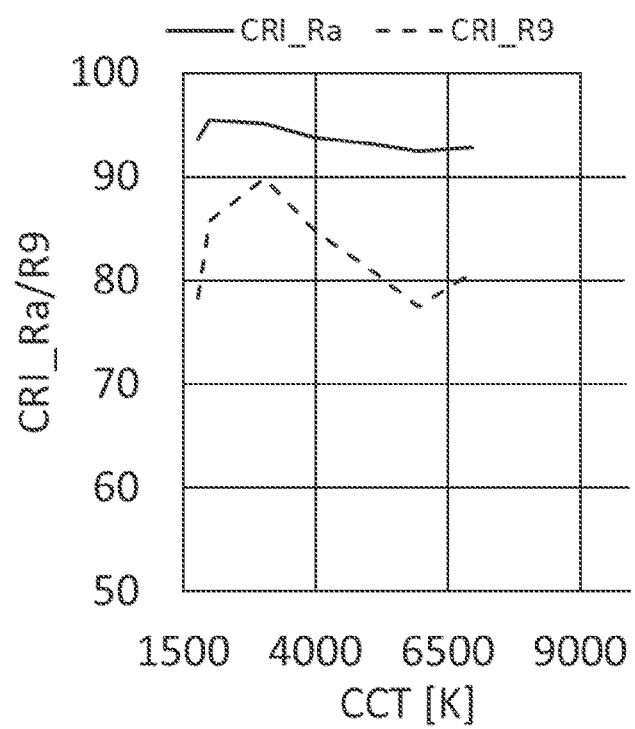

FIG. 6A shows the blue, cyan-yellow, and red color points for this example on a chromaticity diagram. FIG. 6B shows the emission spectra of the blue, cyan-yellow, and red LED groups. In this example, each LED in the first group (blue color point) comprises a blue emitting semiconductor diode in combination with the garnet phosphor in silicone with x=0.02, a=0, b=0.36, using a phosphor mass of 7.4 percent phosphor of the silicone mass. Each LED in the second group (yellow-cyan color point) comprises a blue emitting semiconductor diode in combination with 87% (mass) garnet phosphor with x=0.025, a=1-0.025, b=0, 13% (mass) garnet phosphor with x=0.02, a=0, b=0, Nitride A (99%) with y=0.005, c=0.88, and Nitride B (1%) with z=0.007. The weight ratio of garnets to nitrides=132, with a phosphor mass of 150 percent of the silicone mass. Each LED in the third group (red color point) comprises a blue emitting semiconductor diode in combination with garnet phosphor with x=0.02, a=0, b=0, Nitride A (83%) with y=0.005, c=0.88, and Nitride B (17%) with z=0.007. The weight ratio of garnets to nitrides=0.58, with a phosphor mass of 82 percent of the silicone mass. FIG. 6C shows variation of Flux and LE with CCT, FIG. 6D shows variation of CCT with driving current to the blue, cyan-yellow, and red LED groups, and FIG. 6E shows variation of color rendering parameters Ra and R9 with CCT. Characteristics of the specific LED and phosphor combinations, as well as other operating characteristics are shown in the table of FIG. 6F.

Example 6 and Example 7

In these examples, the blue color point LEDs each comprise a blue emitting semiconductor diode structure combined with a single first phosphor that absorbs blue light and emits red light, the cyan-yellow color point LEDs each comprise a blue emitting semiconductor diode structure combined with a single second phosphor that absorbs blue light and emits cyan light, and the red color point LEDs each comprise a blue emitting semiconductor diode structure combined with the first phosphor and with the second phosphor, and no other phosphors.

Figure 7A:
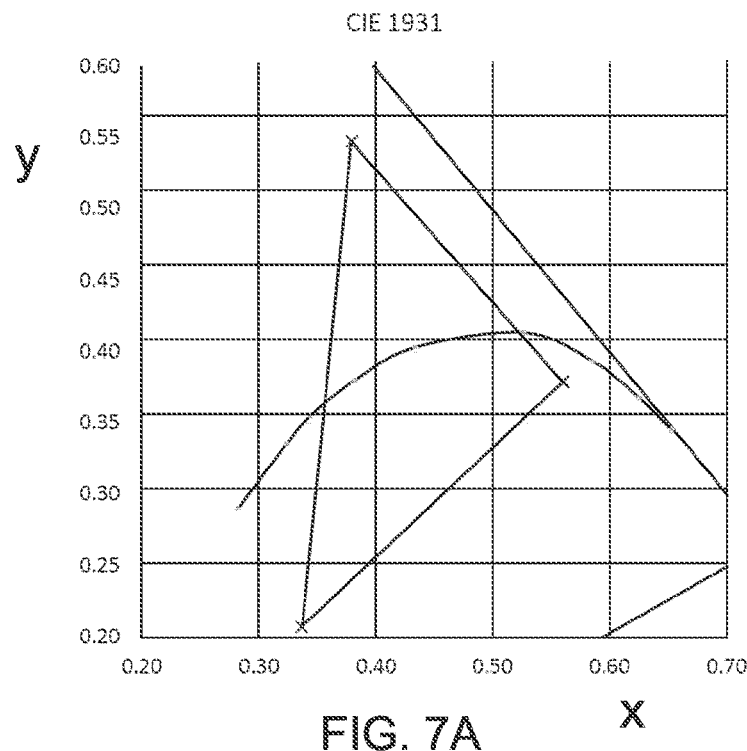
FIG. 7A, FIG. 7B, FIG. 7C, FIG. 7D, and FIG. 7E illustrate, respectively, a graph showing blue, cyan-yellow, and red color points and the Planckian locus, a graph of spectral power versus wavelength, a graph with current versus correlated color temperature (CCT), a graph of flux versus correlated color temperature, and a graph of color rendering index (CRI_Ra/R9) versus correlated color temperature for the light emitting device of Example 6 described below.
Figure 7B:
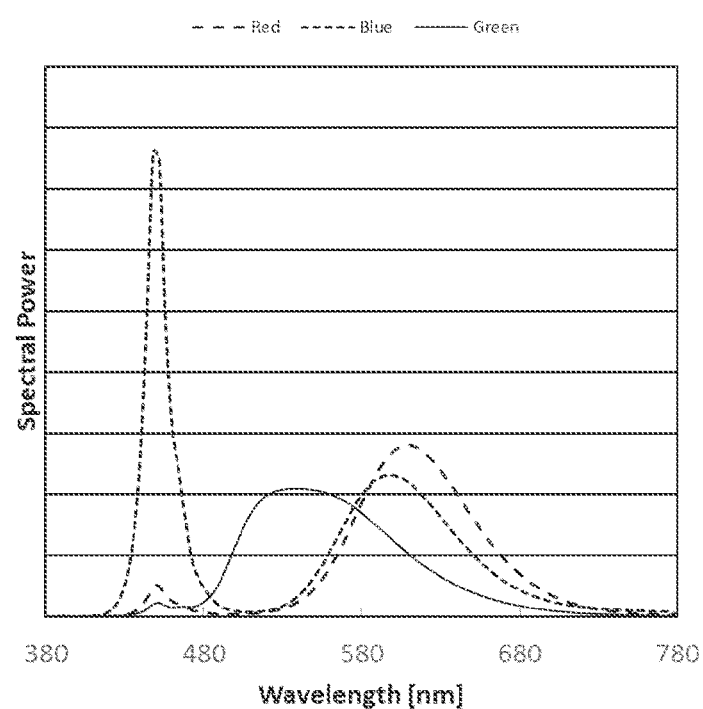
Figure 7C:
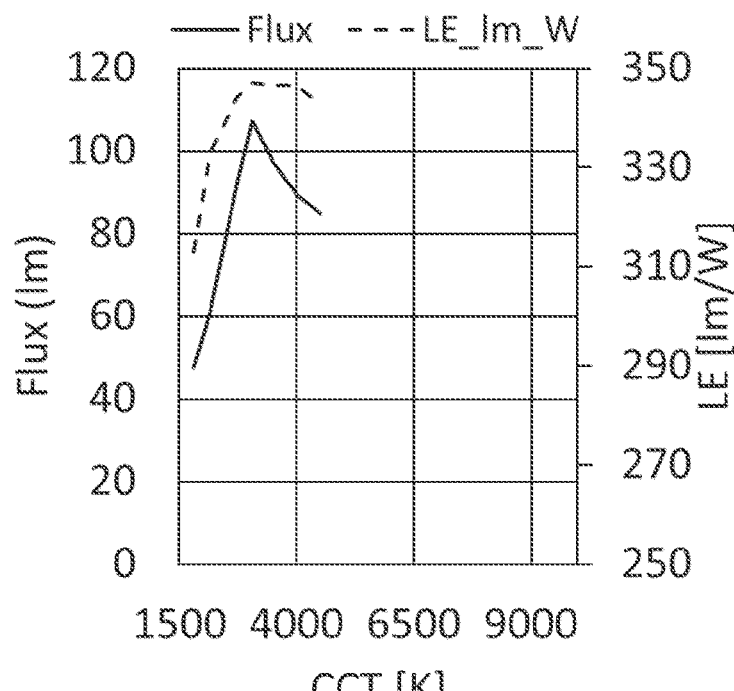
Figure 7D:
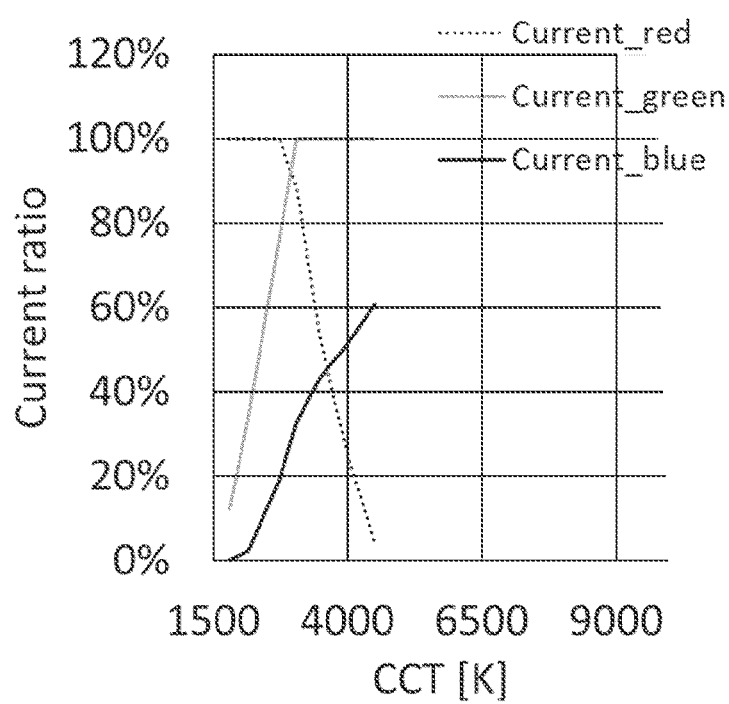
Figure 7E:
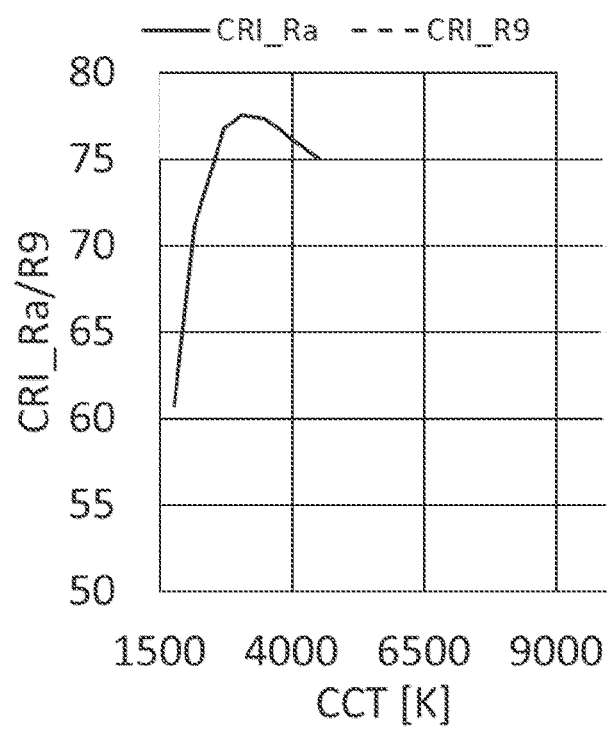

In Example 6, the semiconductor diode structures emit blue light, the first phosphor is $Ba_{0.8}Sr_{1.17}Eu_{0.03}Si_5N_8$, and the second phosphor is $Y_{2.91}Ce_{0.09}Al_{4.8}Ga_{0.2}O_{12}$. FIG. 7A shows the blue, cyan-yellow, and red color points for this example on a chromaticity diagram. FIG. 7B shows the emission spectra of the blue, cyan-yellow, and red LED groups. FIG. 7C shows variation of Flux and LE with CCT, FIG. 7D shows variation of CCT with driving current to the blue, cyan-yellow, and red LED groups, and FIG. 7E shows variation of color rendering parameters Ra and R9 with CCT. Characteristics of the specific LED and phosphor combinations, as well as other operating characteristics are shown in the table of FIG. 7F.

Figure 8A:
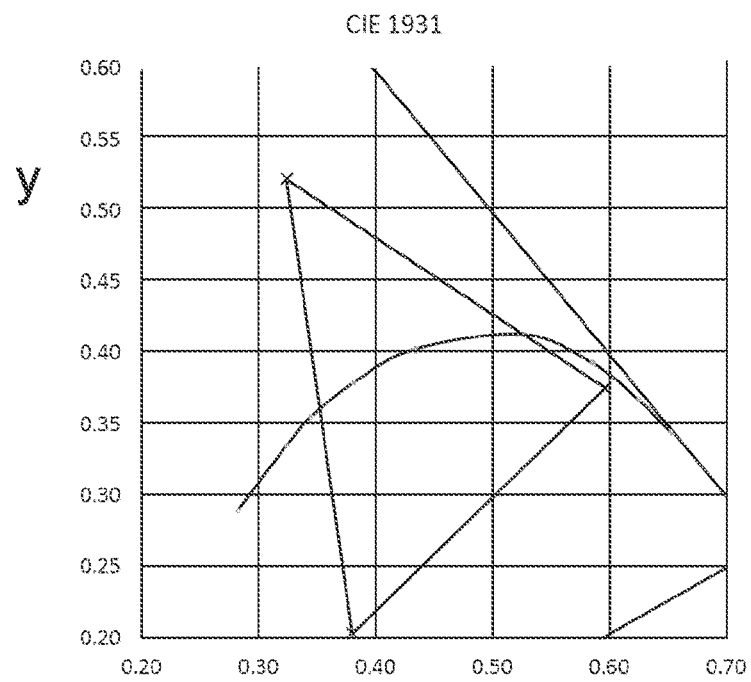
FIG. 8A, FIG. 8B, FIG. 8C, FIG. 8D, and FIG. 8E illustrate, respectively, a graph showing blue, cyan-yellow, and red color points and the Planckian locus, a graph of spectral power versus wavelength, a graph with current versus correlated color temperature (CCT), a graph of flux versus correlated color temperature, and a graph of color rendering index (CRI_Ra/R9) versus correlated color temperature for the light emitting device of Example 7 described below.
Figure 8B:
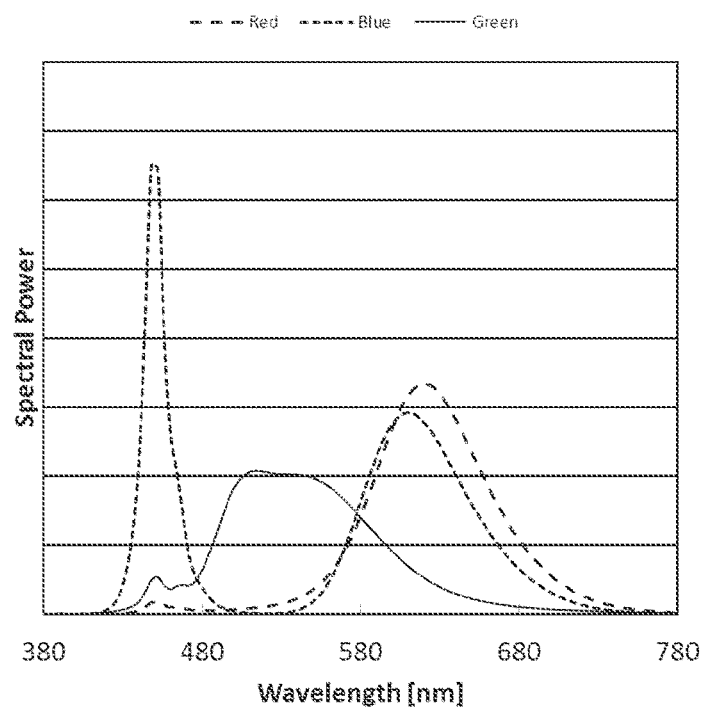
Figure 8C:
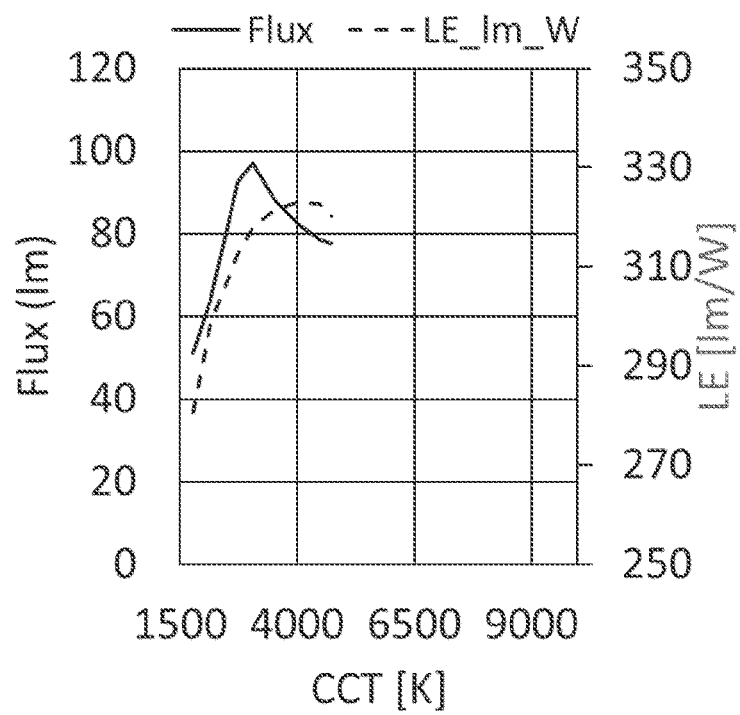
Figure 8D:
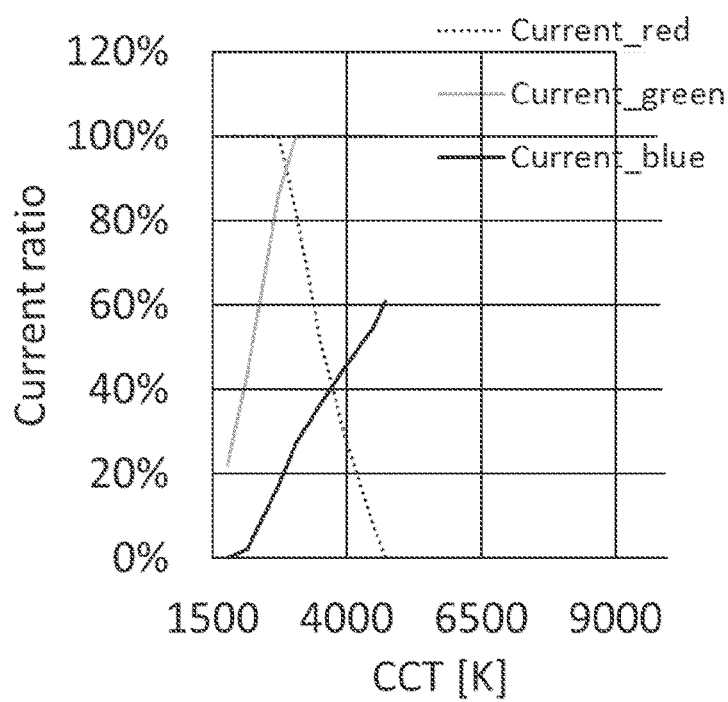
Figure 8E:
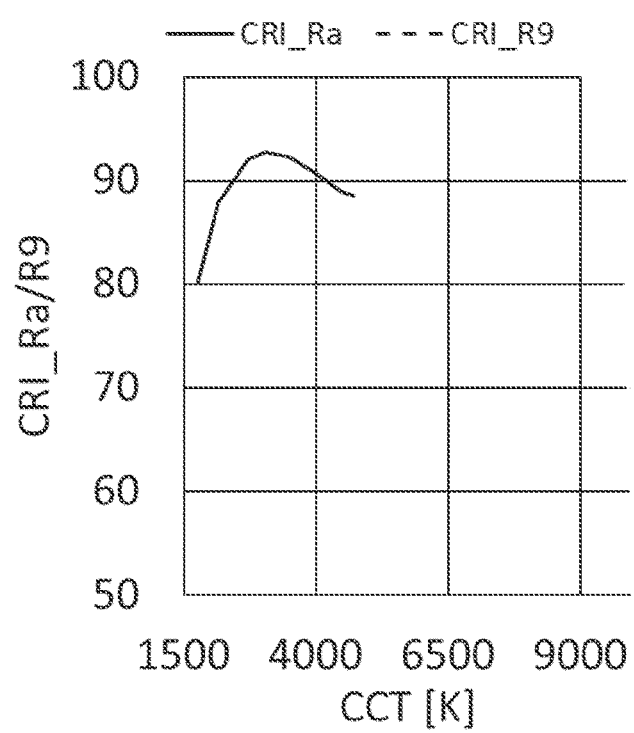

In Example 7, the semiconductor diode structures emit blue light, the first phosphor is $Ca_{0.13}Sr_{0.84}Eu_{0.03}AlSiN_3$, and the second phosphor is $Lu_{2.94}Ce_{0.06}Al_5O_{12}$. FIG. 8A shows the blue, cyan-yellow, and red color points for this example on a chromaticity diagram. FIG. 8B shows the emission spectra of the blue, cyan-yellow, and red LED groups. FIG. 8C shows variation of Flux and LE with CCT, FIG. 8D shows variation of CCT with driving current to the blue, cyan-yellow, and red LED groups, and FIG. 8E shows variation of color rendering parameters Ra and R9 with CCT. Characteristics of the specific LED and phosphor combinations, as well as other operating characteristics are shown in the table of FIG. 8F.

This disclosure is illustrative and not limiting. Further modifications will be apparent to one skilled in the art in light of this disclosure and are intended to fall within the scope of the appended claims.

What is claimed is:

1. A light emitting device comprising:
    a first group of one or more light emitting diodes ("LEDs") each configured to emit light having a blue color point in a 1931 International Commission on Illuminations ("CIE") x,y Chromaticity Diagram, the first group having an average 1931 CIE x,y color point of $x_{blue}$, $y_{blue}$ with $y_{blue} \leq 0.295$;
    a second group of one or more LEDs each configured to emit light having a cyan or yellow color point in the 1931 CIE x,y Chromaticity Diagram, the second group having an average 1931 CIE x,y color point of $x_{yellow-cyan}$, $y_{yellow-cyan}$;
    a third group of one or more LEDs each configured to emit light having a red color point in the 1931 CIE x,y Chromaticity Diagram, the third group having an average 1931 CIE x,y color point of $X_{red}$, $y_{red}$;
    the first group of LEDs, the second group of LEDs, and the third group of LEDs are arranged to combine light emitted by the LEDs to form a white light output from the light emitting device;

$$1.10 \leq (x_{blue} + x_{yellow-cyan} + x_{red}) \leq 1.40;$$

$$1.05 \leq (y_{blue} + y_{yellow-cyan} + y_{red}) \leq 1.25;$$

each of the LEDs in the first, second, and third groups has a color point for which the x value in the 1931 CIE x,y Chromaticity Diagram is greater than 0.15; and
    each of the LEDs in the first, second, and third groups has a color point for which the y value in the 1931 CIE x,y Chromaticity Diagram is greater than 0.15.

2. The light emitting device of claim 1, wherein:

$$1.15 \leq (x_{blue} + x_{yellow-cyan} + x_{red}) \leq 1.40;$$

$$1.10 \leq (y_{blue} + y_{yellow-cyan} + y_{red}) \leq 1.25;$$

each of the LEDs in the first, second, and third groups has a color point for which the x value in the 1931 CIE x,y Chromaticity Diagram is greater than 0.2; and
    each of the LEDs in the first, second, and third groups has a color point for which the y value in the 1931 CIE x,y Chromaticity Diagram is greater than 0.2.

3. The light emitting device of claim 1, wherein:

$$1.20 \leq (x_{blue} + x_{yellow-cyan} + x_{red}) \leq 1.32;$$

$$1.10 \leq (y_{blue} + y_{yellow-cyan} + y_{red}) \leq 1.20;$$

each of the LEDs in the first, second, and third groups has a color point for which the x value in the 1931 CIE x,y Chromaticity Diagram is greater than 0.2; and
    each of the LEDs in the first, second, and third groups has a color point for which the y value in the 1931 CIE x,y Chromaticity Diagram is greater than 0.2.

4. The light emitting device of claim 1, wherein the color points ($x_{blue}$, $y_{blue}$), ($x_{yellow-cyan}$, $y_{yellow-cyan}$), and ($x_{red}$, $y_{red}$) span an absolute gamut in the CIE 1931 x,y Chromaticity Diagram of 0.01<gamut area <0.07.

5. The light emitting device of claim 1, wherein the color points ($x_{blue}$, $y_{blue}$), ($x_{yellow-cyan}$, $y_{yellow-cyan}$), and ($x_{red}$, $y_{red}$) span an absolute gamut in the CIE 1931 x,y Chromaticity Diagram 0.015<gamut area <0.055.

6. The light emitting device of claim 1, wherein the color points ($x_{blue}$, $y_{blue}$), ($x_{yellow-cyan}$, $y_{yellow-cyan}$), and ($x_{red}$, $y_{red}$) span an absolute gamut in the CIE 1931 x,y Chromaticity Diagram of 0.02<gamut area <0.045.

7. The light emitting device of claim 1, wherein the blue color point is desaturated.

8. The light emitting device of claim 7, wherein the cyan or yellow color point is desaturated.

9. The light emitting device of claim 8, wherein the red color point is desaturated.

10. The light emitting device of claim 1, wherein all of the LEDs in the first group, the second group, and the third group are phosphor-converted LEDs comprising a semiconductor diode structure configured to emit blue light and one or more phosphors arranged to absorb blue light emitted by the semiconductor diode structure and in response emit light of longer wavelengths.

11. The light emitting device of claim 1, wherein:
    the LEDs of the first group each comprise a semiconductor diode structure configured to emit blue light and a first phosphor arranged to absorb blue light emitted by the semiconductor diode structure and in response emit light of a longer wavelength mixed with unabsorbed blue light, and no other phosphors;
    the LEDs of the second group each comprise a semiconductor diode structure configured to emit blue light and a second phosphor arranged to absorb blue light emitted by the semiconductor diode structure and in response emit light of a longer wavelength, and no other phosphors; and the LEDs of the third group each comprise a semiconductor diode structure configured to emit blue light, the first phosphor arranged to absorb blue light emitted by the semiconductor diode structure and in response emit light of a longer wavelength, and the second phosphor arranged to absorb blue light emitted by the semiconductor diode structure and in response emit light of a longer wavelength, and no other phosphors.

12. The light emitting device of claim 11, wherein:
the first phosphor absorbs blue light and emits red light; and
the second phosphor absorbs blue light and emits cyan light.

13. The light emitting device of claim 1, wherein:
the LEDs in the first group, the second group, and the third group are phosphor-converted LEDs comprising a semiconductor diode structure configured to emit blue light and one or more phosphors arranged to absorb blue light emitted by the semiconductor diode structure and in response emit light of longer wavelengths; and
the color points $(x_{blue}, y_{blue})$, $(x_{yellow-cyan}, y_{yellow-cyan})$, and $(x_{red}, y_{red})$ span an absolute gamut in the CIE 1931 x,y Chromaticity Diagram of 0.01<gamut area <0.07.

14. The light emitting device of claim 13, wherein:
the LEDs of the first group each comprise a first phosphor arranged to absorb blue light and in response emit light of a longer wavelength mixed with unabsorbed blue light, and no other phosphors;
the LEDs of the second group each comprise a second phosphor arranged to absorb blue light and in response emit light of a longer wavelength, and no other phosphors; and
the LEDs of the third group each comprise the first phosphor arranged to absorb blue light emitted and in response emit light of a longer wavelength, and the second phosphor arranged to absorb blue light and in response emit light of a longer wavelength, and no other phosphors.

15. The light emitting device of claim 14, wherein:
the first phosphor absorbs blue light and emits red light; and
the second phosphor absorbs blue light and emits cyan light.

16. A light emitting device comprising:
a first group of one or more light emitting diodes ("LEDs") each configured to emit light having a blue color point in a 1931 International Commission on Illuminations ("CIE") x,y Chromaticity Diagram, the first group having an average 1931 CIE x,y color point of $x_{blue}, y_{blue}$;

a second group of one or more LEDs each configured to emit light having a cyan or yellow color point in the 1931 CIE x,y Chromaticity Diagram, the second group having an average 1931 CIE x,y color point of $x_{yellow-cyan}, y_{yellow-cyan}$ with $y_{yellow-cyan} \leq 0.492$;

a third group of one or more LEDs each configured to emit light having a red color point in the 1931 CIE x,y Chromaticity Diagram, the third group having an average 1931 CIE x,y color point of $x_{red}, y_{red}$;

the first group of LEDs, the second group of LEDs, and the third group of LEDs are arranged to combine light emitted by the LEDs to form a white light output from the light emitting device;

$$1.10 \leq (x_{blue} + x_{yellow-cyan} + x_{red}) \leq 1.40;$$
$$1.05 \leq (y_{blue} + y_{yellow-cyan} + y_{red}) \leq 1.25;$$

each of the LEDs in the first, second, and third groups has a color point for which the x value in the 1931 CIE x,y Chromaticity Diagram is greater than 0.15; and
each of the LEDs in the first, second, and third groups has a color point for which the y value in the 1931 CIE x,y Chromaticity Diagram is greater than 0.15.

17. The light emitting device of claim 1, wherein:

$$1.20 \leq (x_{blue} + x_{yellow-cyan} + x_{red}) \leq 1.32;$$
$$1.10 \leq (y_{blue} + y_{yellow-cyan} + y_{red}) \leq 1.20;$$

each of the LEDs in the first, second, and third groups has a color point for which the x value in the 1931 CIE x,y Chromaticity Diagram is greater than 0.2; and
each of the LEDs in the first, second, and third groups has a color point for which the y value in the 1931 CIE x,y Chromaticity Diagram is greater than 0.2.

18. The light emitting device of claim 1, wherein the color points $(x_{blue}, y_{blue})$, $(x_{yellow-cyan}, y_{yellow-cyan})$, and $(x_{red}, y_{red})$ span an absolute gamut in the CIE 1931 x,y Chromaticity Diagram of 0.01<gamut area <0.07.

19. The light emitting device of claim 1, wherein the color points $(x_{blue}, y_{blue})$, $(x_{yellow-cyan}, y_{yellow-cyan})$, and $(x_{red}, y_{red})$ span an absolute gamut in the CIE 1931 x,y Chromaticity Diagram 0.015<gamut area <0.055.

20. The light emitting device of claim 1, wherein the color points $(x_{blue}, y_{blue})$, $(x_{yellow-cyan}, y_{yellow-cyan})$, and $(x_{red}, y_{red})$ span an absolute gamut in the CIE 1931 x,y Chromaticity Diagram of 0.02<gamut area <0.045.

* * * * *